(12) United States Patent
Ominami et al.

(10) Patent No.: US 9,741,530 B2
(45) Date of Patent: Aug. 22, 2017

(54) CHARGED-PARTICLE-BEAM DEVICE, SPECIMEN-IMAGE ACQUISITION METHOD, AND PROGRAM RECORDING MEDIUM

(71) Applicant: Hitachi High-Technologies Corporation, Minato-ku, Tokyo (JP)

(72) Inventors: Yusuke Ominami, Tokyo (JP); Kenji Nakahira, Tokyo (JP); Maki Tanaka, Tokyo (JP); Shinsuke Kawanishi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 15/110,284

(22) PCT Filed: Dec. 3, 2014

(86) PCT No.: PCT/JP2014/081922
§ 371 (c)(1),
(2) Date: Jul. 7, 2016

(87) PCT Pub. No.: WO2015/111307
PCT Pub. Date: Jul. 30, 2015

(65) Prior Publication Data
US 2016/0336145 A1    Nov. 17, 2016

(30) Foreign Application Priority Data

Jan. 27, 2014    (JP) .................................. 2014-012083

(51) Int. Cl.
*G01K 1/08*    (2006.01)
*H01J 37/22*    (2006.01)
(Continued)

(52) U.S. Cl.
CPC .......... *H01J 37/222* (2013.01); *H01J 37/185* (2013.01); *H01J 37/20* (2013.01); *H01J 37/28* (2013.01);
(Continued)

(58) Field of Classification Search
CPC .. H01J 37/00; H01J 37/02; H01J 37/09; H01J 37/16; H01J 37/18; H01J 37/20; H01J 37/26
(Continued)

(56) References Cited

U.S. PATENT DOCUMENTS 6,797,955 B1 *    9/2004    Adler ...................... H01J 37/28
                                                    250/397
2004/0046120 A1    3/2004    Moses et al.
(Continued)

FOREIGN PATENT DOCUMENTS

DE    11 2011 104 347 B4    8/2015
JP              4-341741 A    11/1992
(Continued)

OTHER PUBLICATIONS

International Search Report (PCT/ISA/210) issued in PCT Application No. PCT/JP2014/081922 dated Jan. 13, 2015 with English-language translation (four (4) pages).
(Continued)

*Primary Examiner* — Jason McCormack
(74) *Attorney, Agent, or Firm* — Crowell & Moring LLP

(57) ABSTRACT

A charged-particle-beam device is provided with a data processing unit that removes, from a detector signal, the effect that scattering of a primary charged-particle beam before the primary charged-particle beam reaches a specimen has on the spot shape of the primary charged-particle beam. For example, when using an electron microscope to observe a specimen in a non-vacuum atmosphere, the effect
(Continued)

that scattering of a primary charged-particle beam due to a barrier film or a gas present in a non-vacuum space has on the spot shape of the primary charged-particle beam is removed from a signal acquired by a detector. This makes it easy to obtain high-quality images.

20 Claims, 23 Drawing Sheets

(51) Int. Cl.
*H01J 37/28* (2006.01)
*H01J 37/18* (2006.01)
*H01J 37/20* (2006.01)

(52) U.S. Cl.
CPC ... *H01J 2237/164* (2013.01); *H01J 2237/221* (2013.01); *H01J 2237/2608* (2013.01); *H01J 2237/2806* (2013.01)

(58) Field of Classification Search
USPC .................. 250/397, 306, 307, 311, 441.11
See application file for complete search history.

(56) References Cited

U.S. PATENT DOCUMENTS

| | | |
|---|---|---|
| 2007/0176102 A1 | 8/2007 | Slingerland et al. |
| 2009/0242763 A1 | 10/2009 | Buijsse |
| 2010/0243888 A1 | 9/2010 | Nishiyama et al. |
| 2011/0187847 A1 | 8/2011 | Bai et al. |
| 2013/0313430 A1 | 11/2013 | Ominami et al. |
| 2014/0021347 A1 | 1/2014 | Ominami et al. |
| 2014/0151553 A1* | 6/2014 | Ominami ................ H01J 37/18 250/307 |
| 2015/0014530 A1 | 1/2015 | Ominami et al. |

FOREIGN PATENT DOCUMENTS

| | | |
|---|---|---|
| JP | 6-318250 A | 11/1994 |
| JP | 2007-207758 A | 8/2007 |
| JP | 2009-245944 A | 10/2009 |
| JP | 2012-221766 A | 11/2012 |
| WO | WO 2010/001399 A1 | 1/2010 |
| WO | WO 2013/042425 A1 | 3/2013 |
| WO | WO 2013/129143 A1 | 9/2013 |

OTHER PUBLICATIONS

Japanese-language Written Opinion (PCT/ISA/237) issued in PCT Application No. PCT/JP2014/081922 dated Jan. 13, 2015 (six (6) pages).

German-language Office Action issued in counterpart German Application No. 11 2014 005 590.5 dated Aug. 16, 2016 with English translation (Nine (9) pages).

* cited by examiner

[Fig. 1]
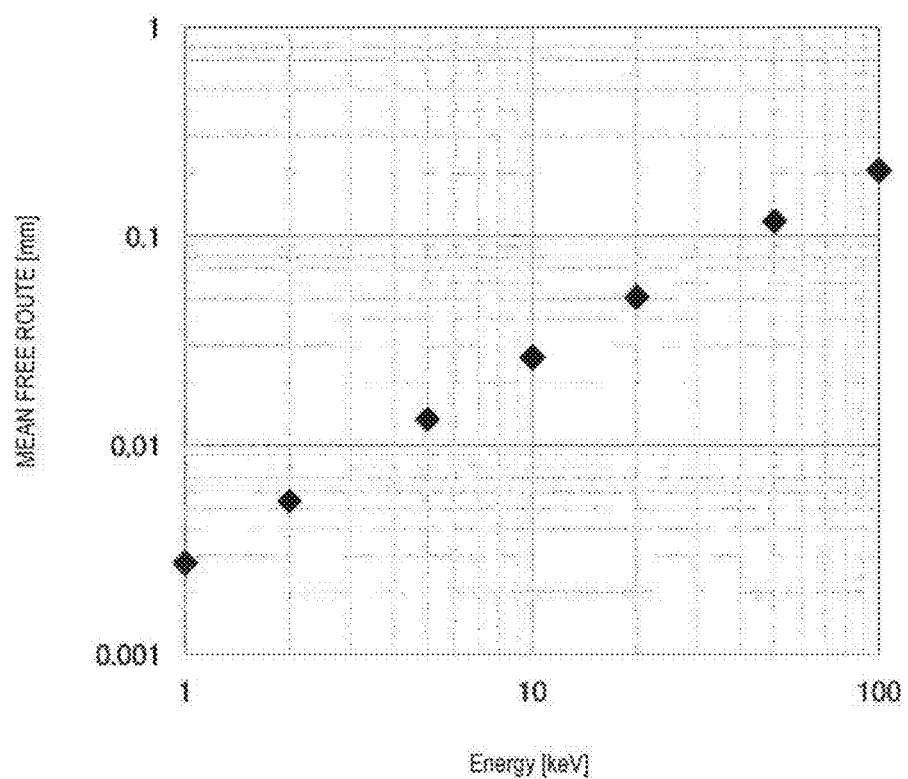

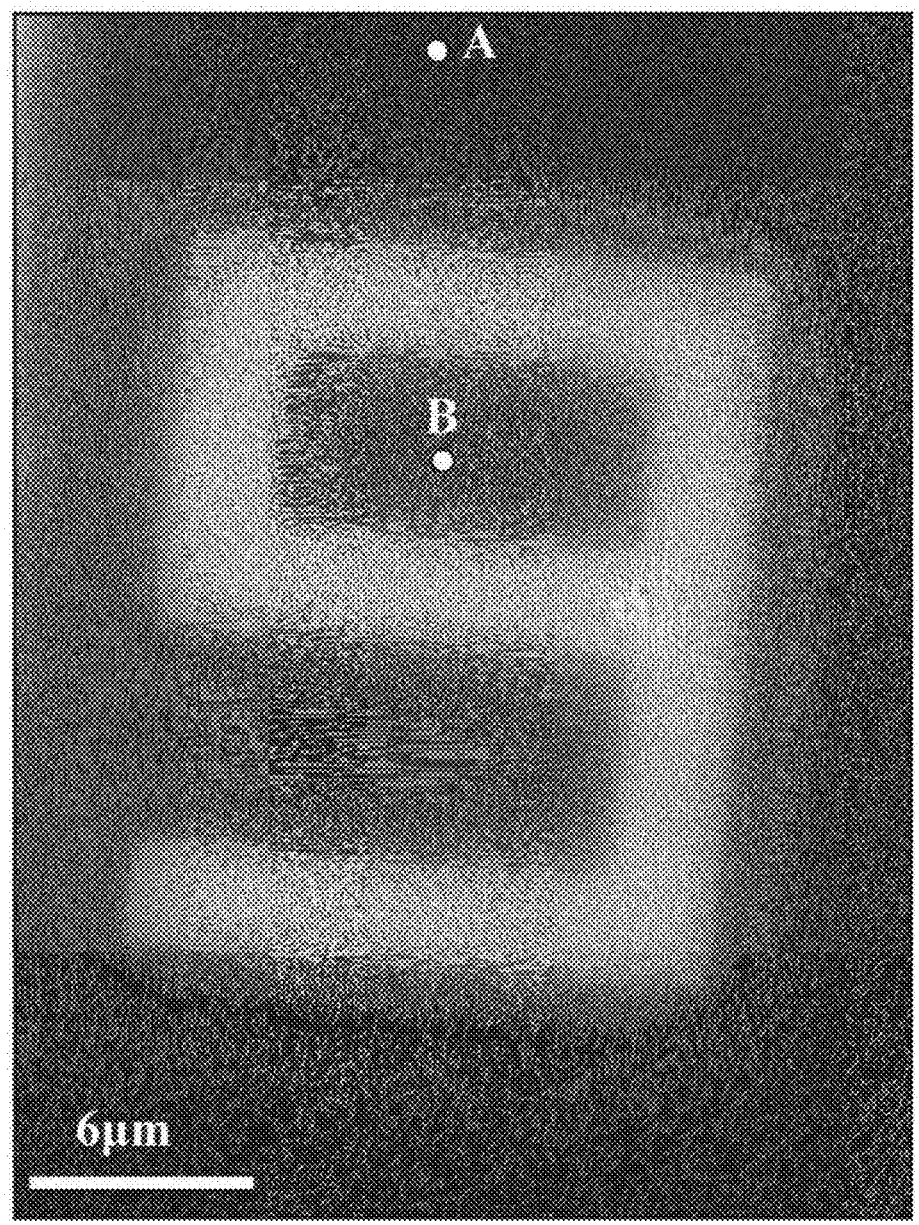
[Fig. 2]

FIG. 5A
FIG. 5B
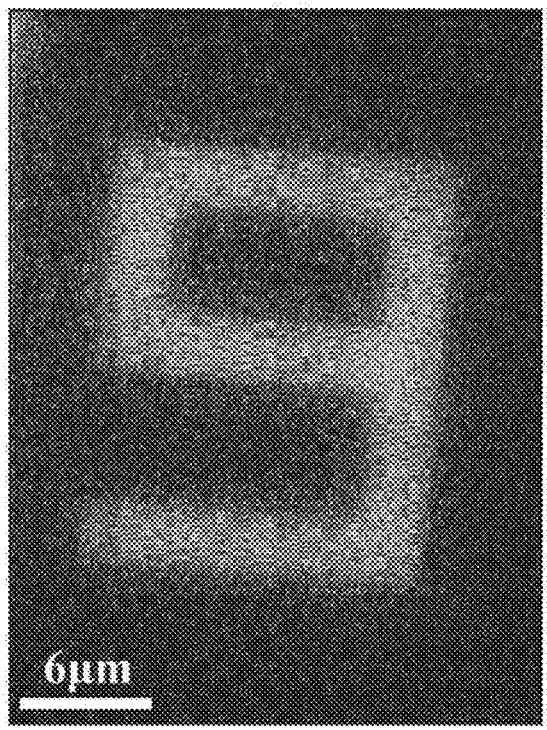
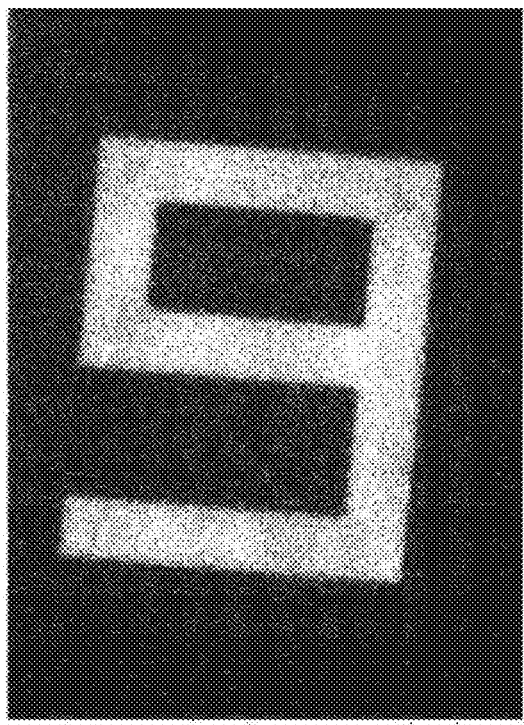

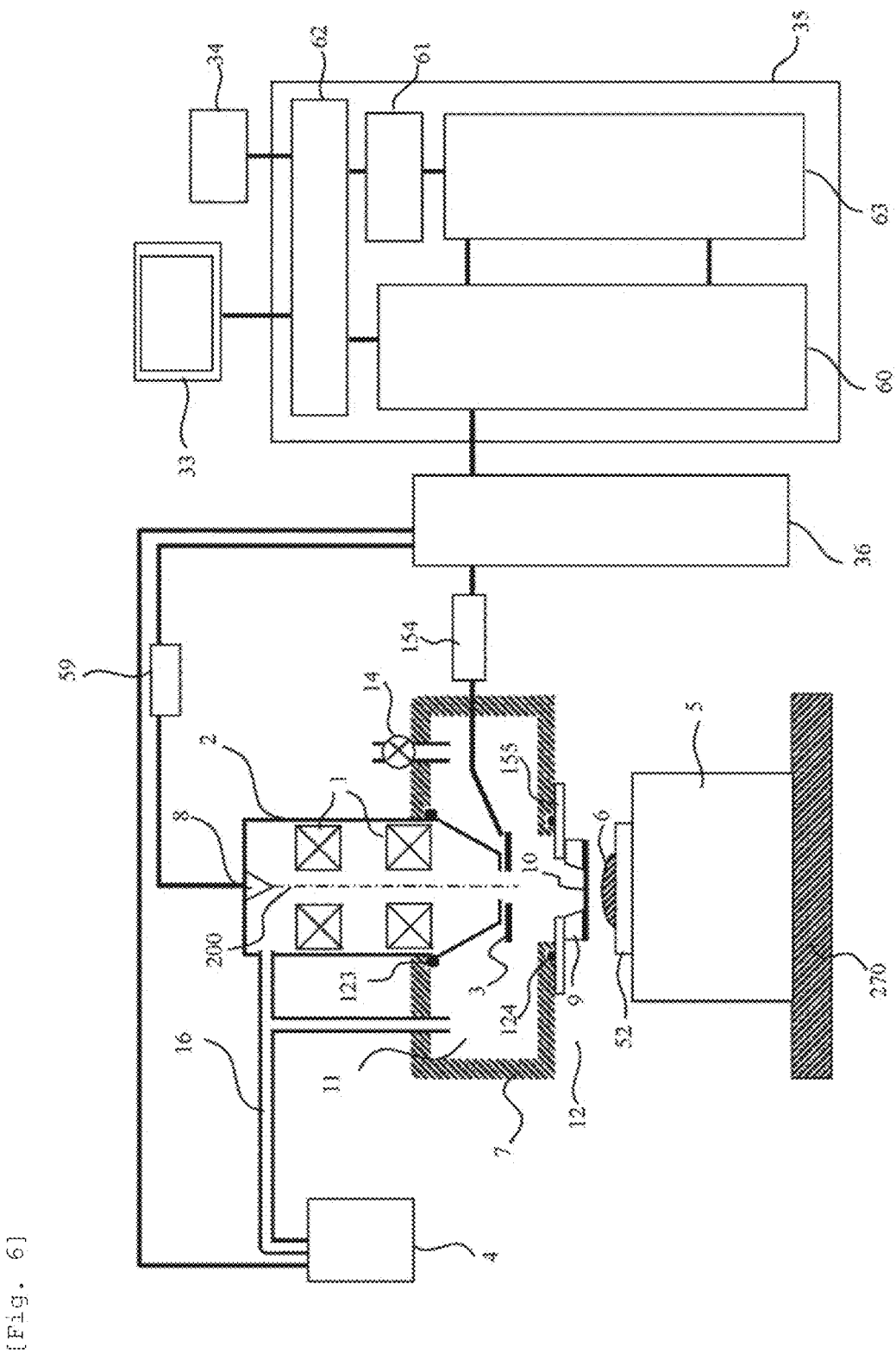
[Fig. 6]

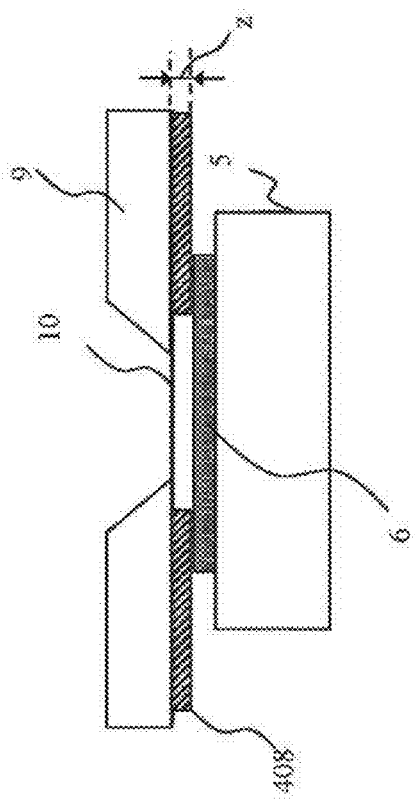
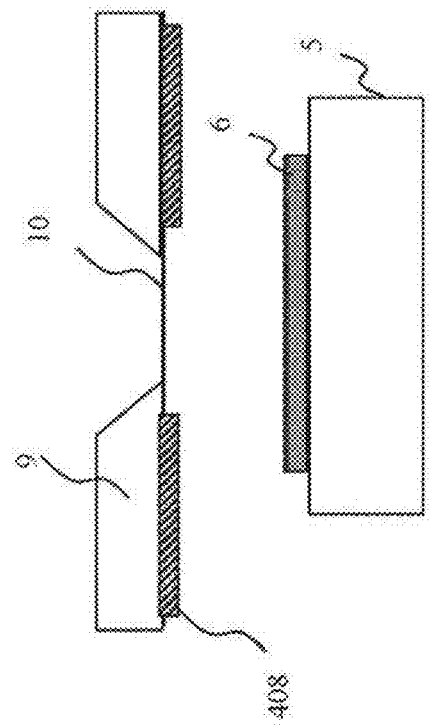
FIG. 8A
FIG. 8B

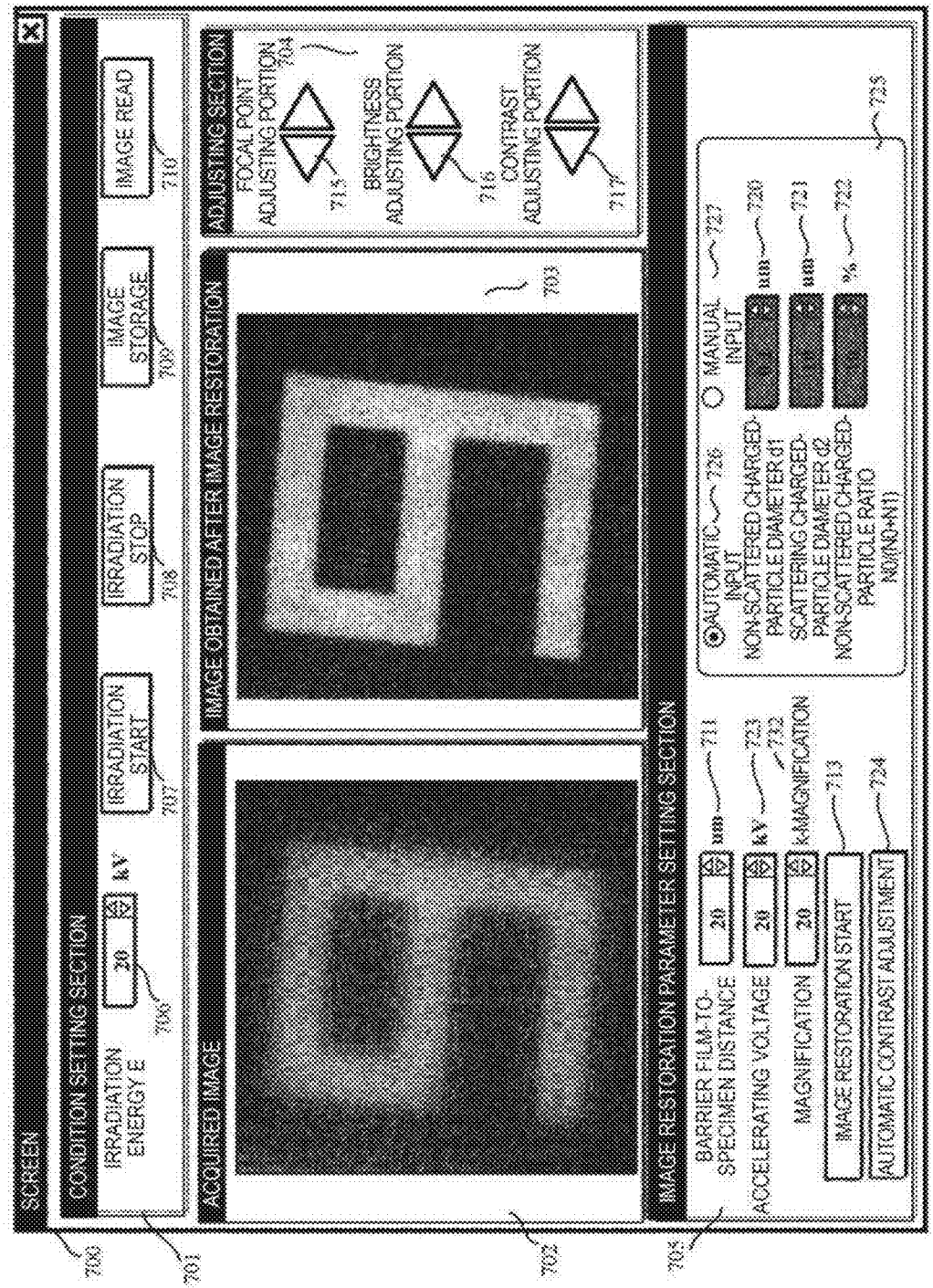
[Fig. 9]

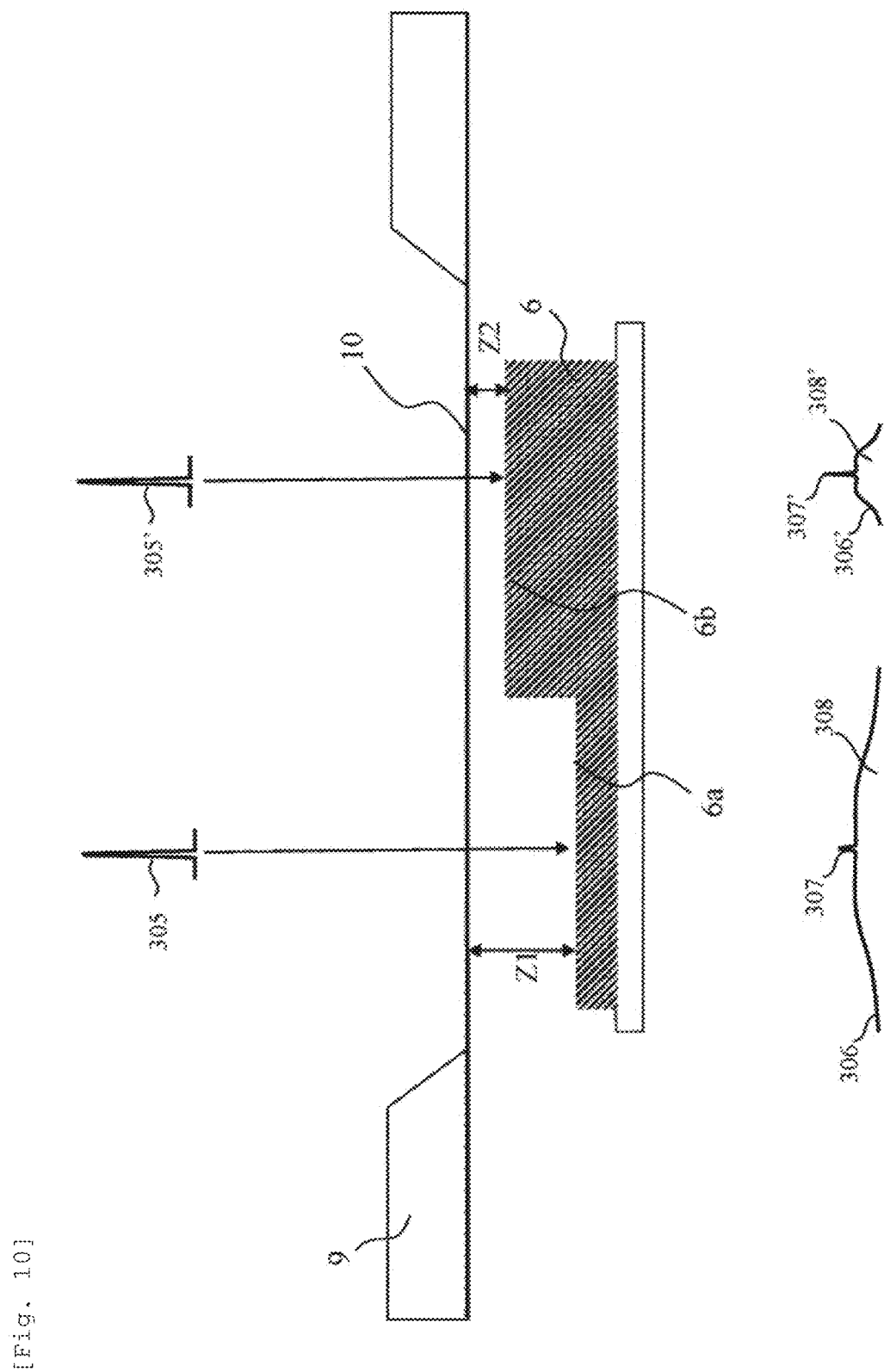

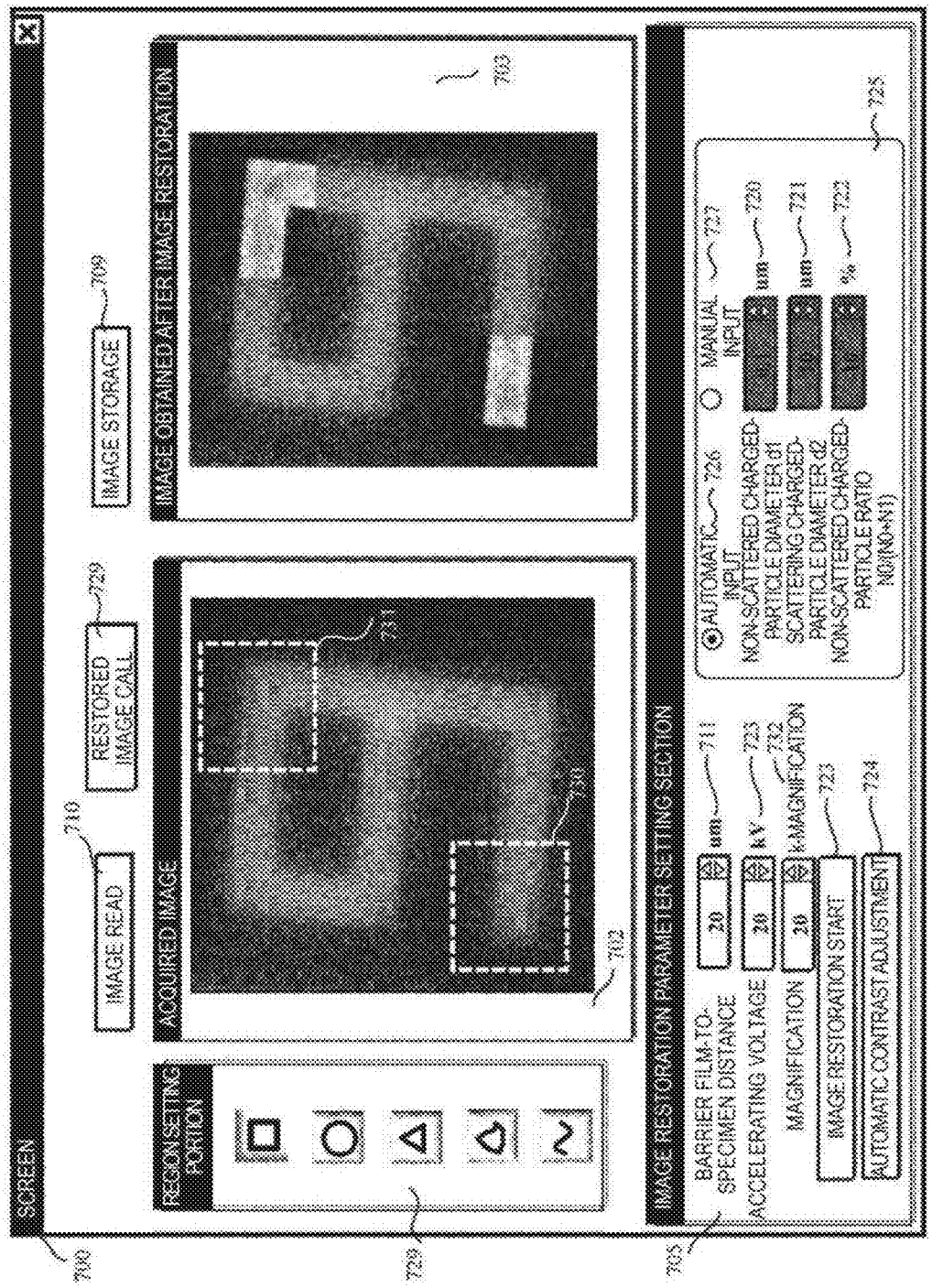
[Fig. 11]

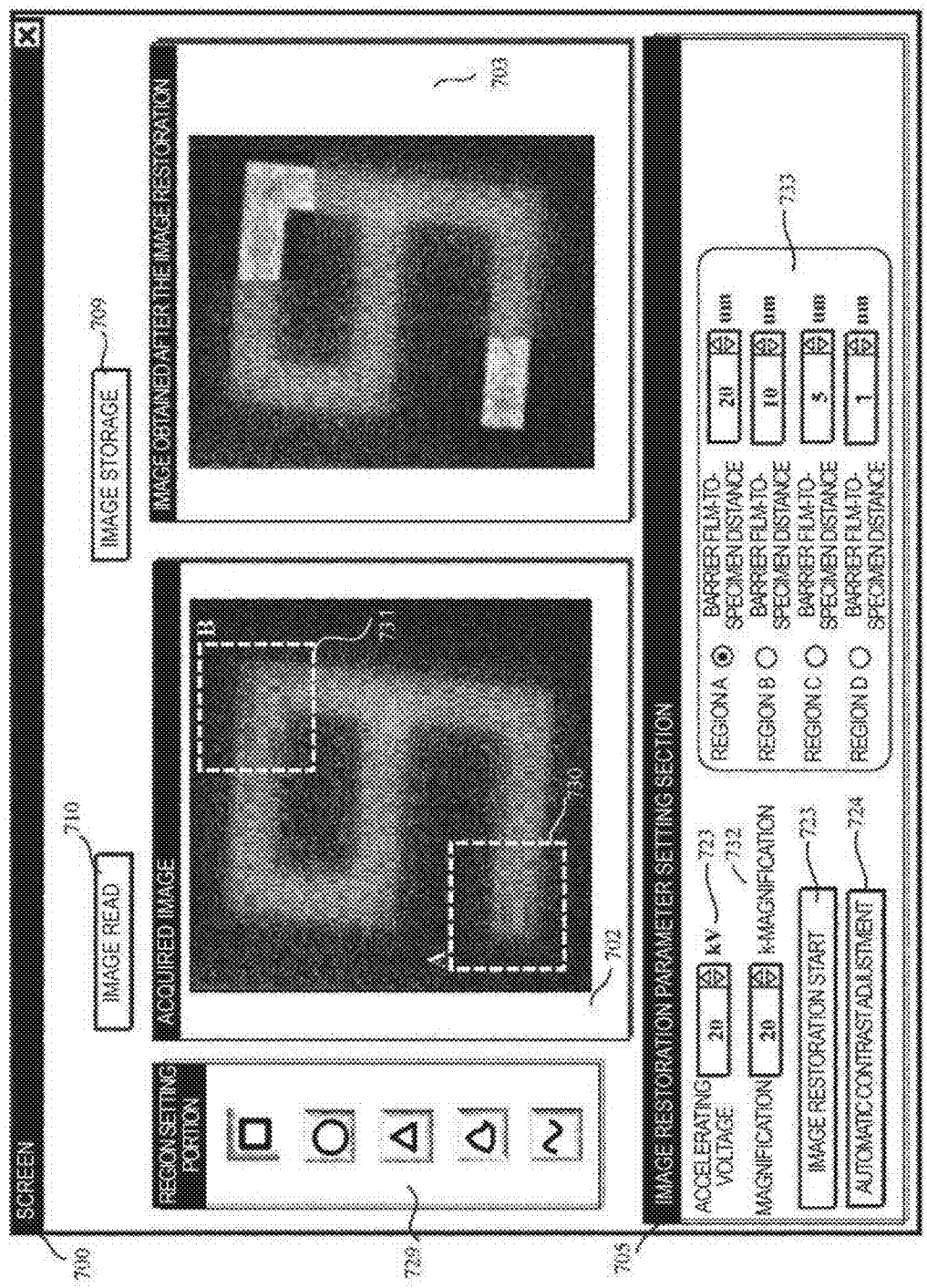
[Fig. 12]

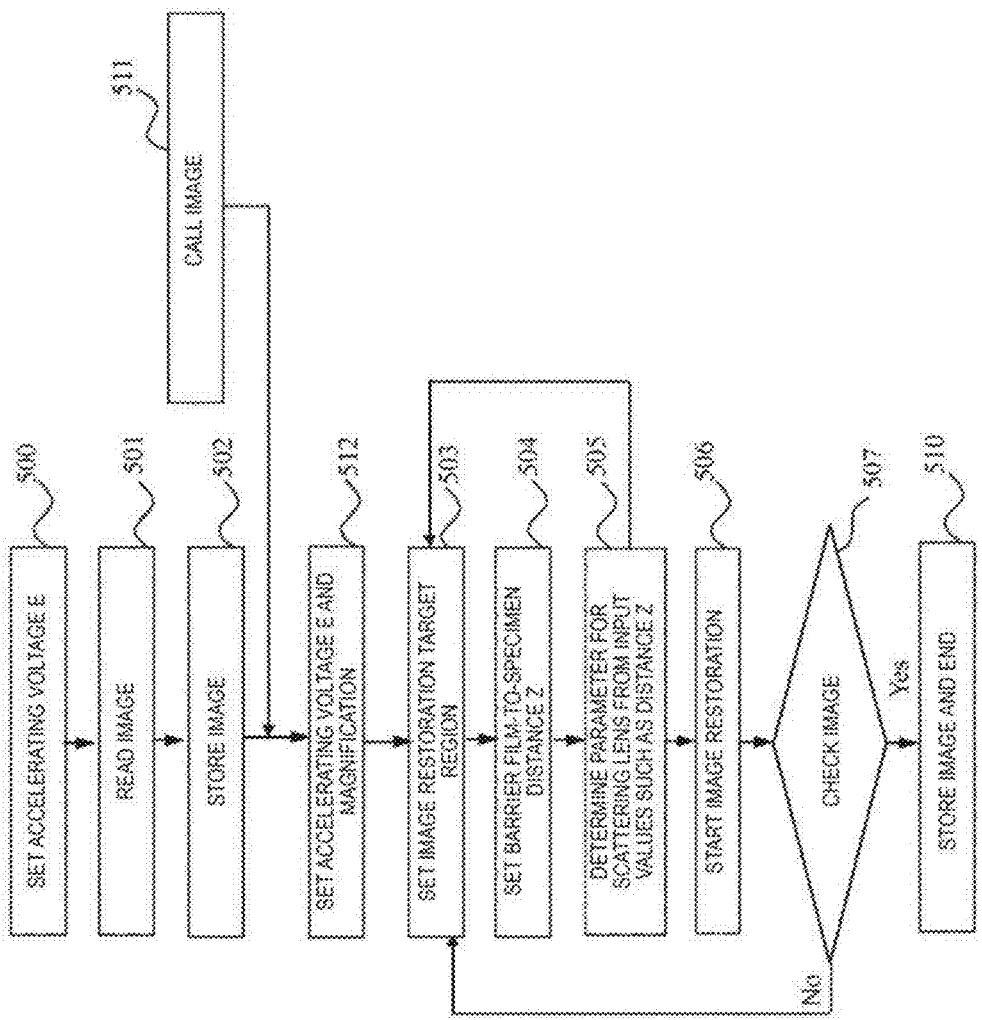
[Fig. 13]

[Fig. 14]
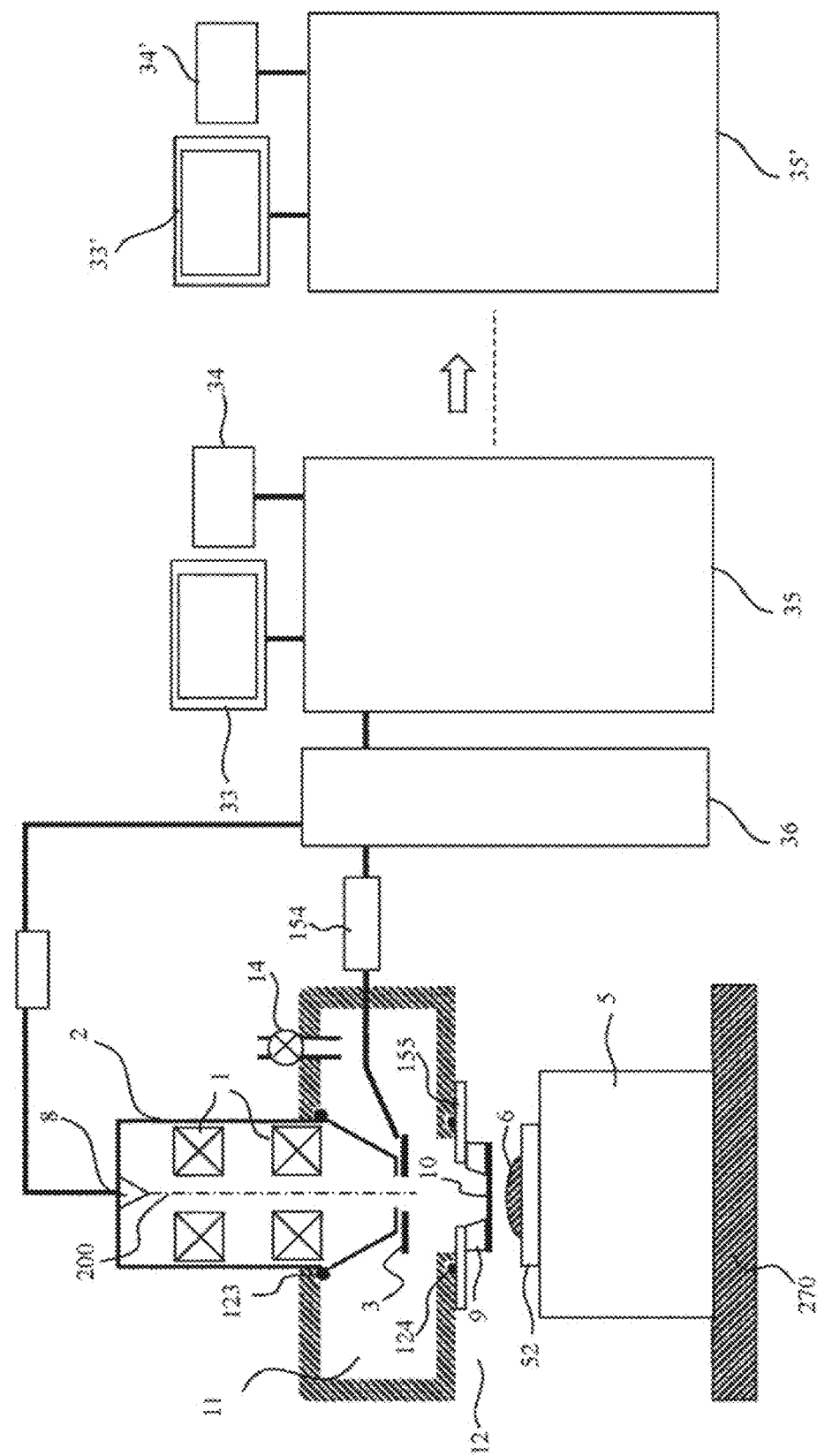

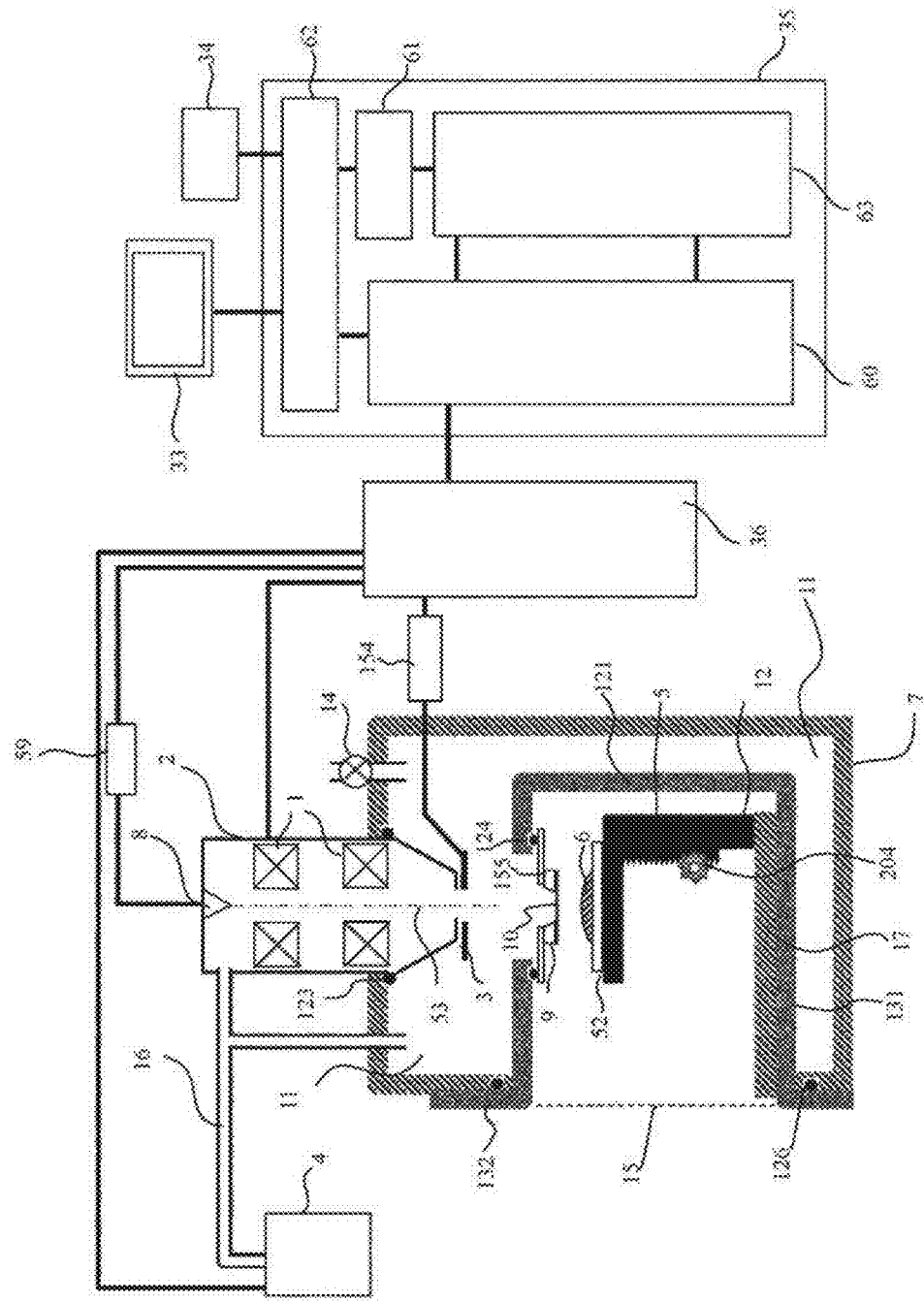
[Fig. 15]

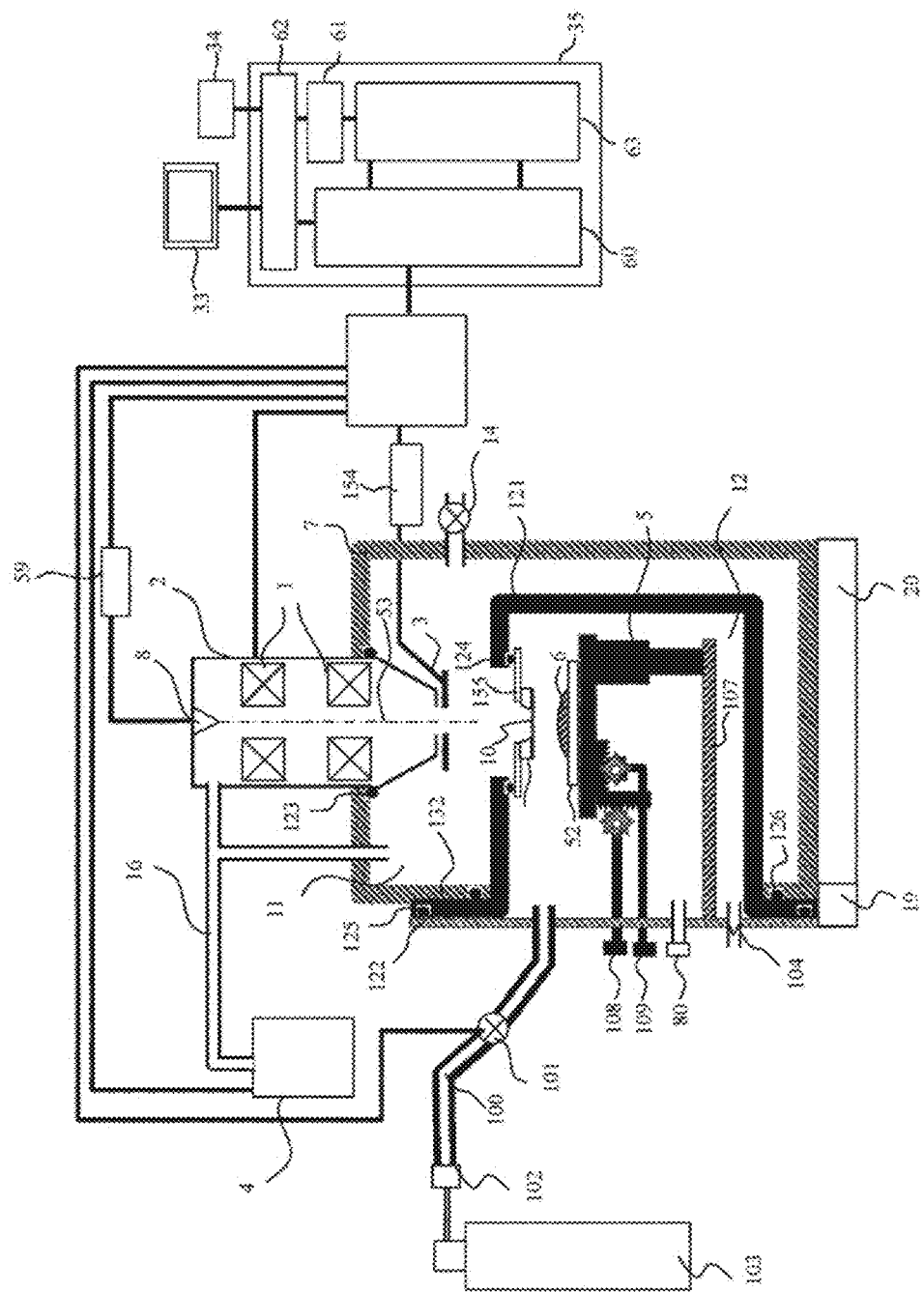
[Fig. 16]

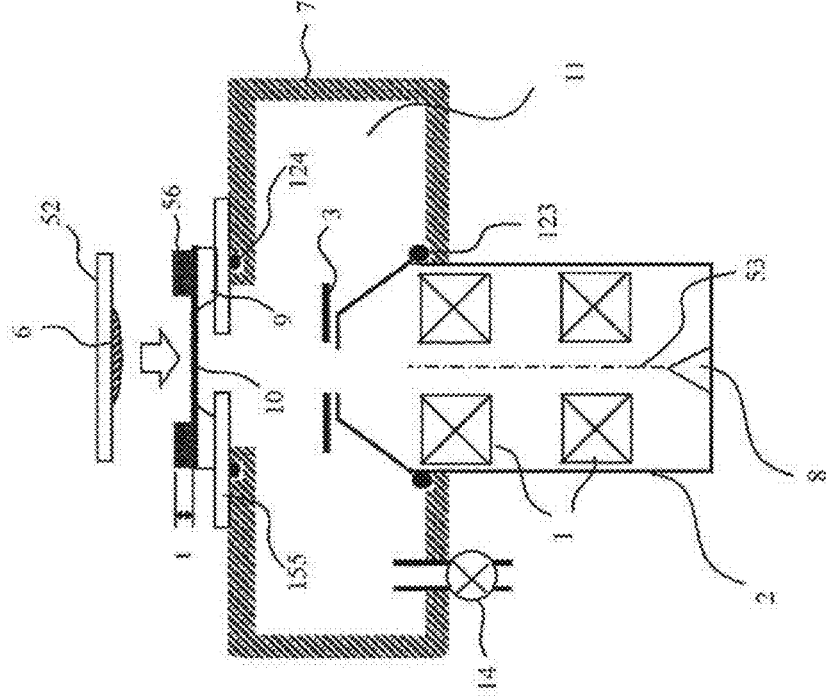
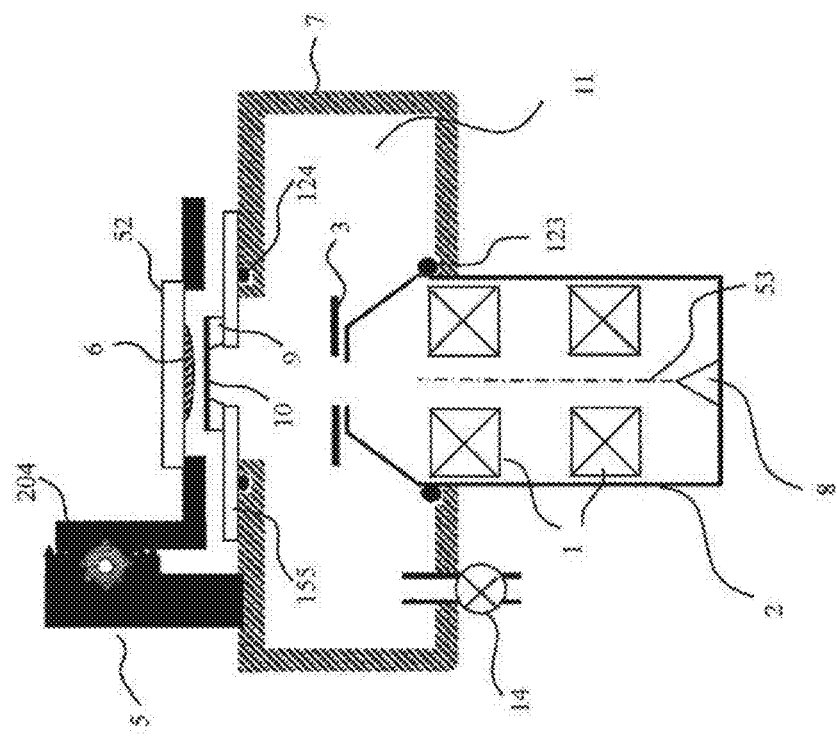
FIG. 17A
FIG. 17B

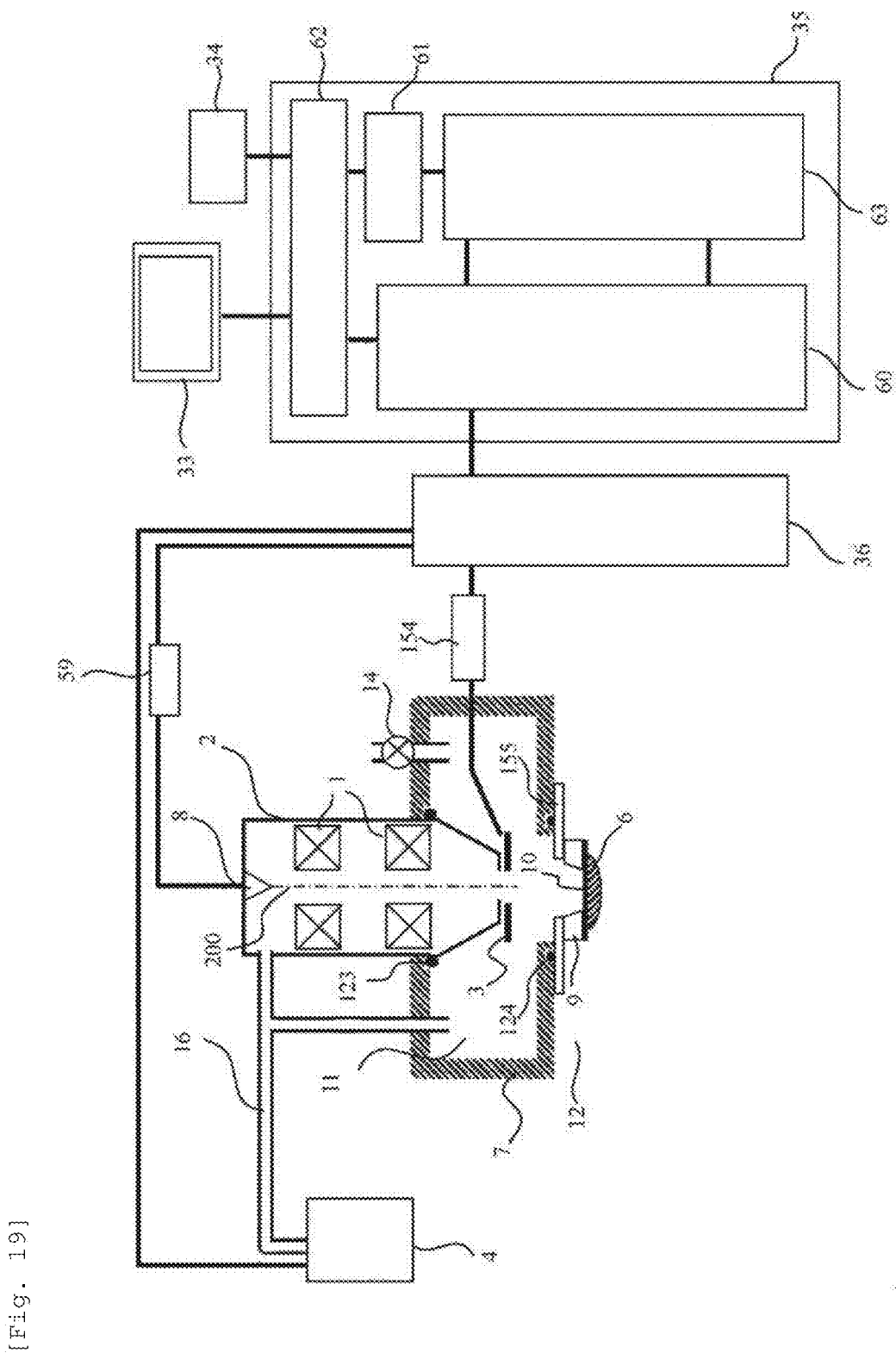
[Fig. 19]

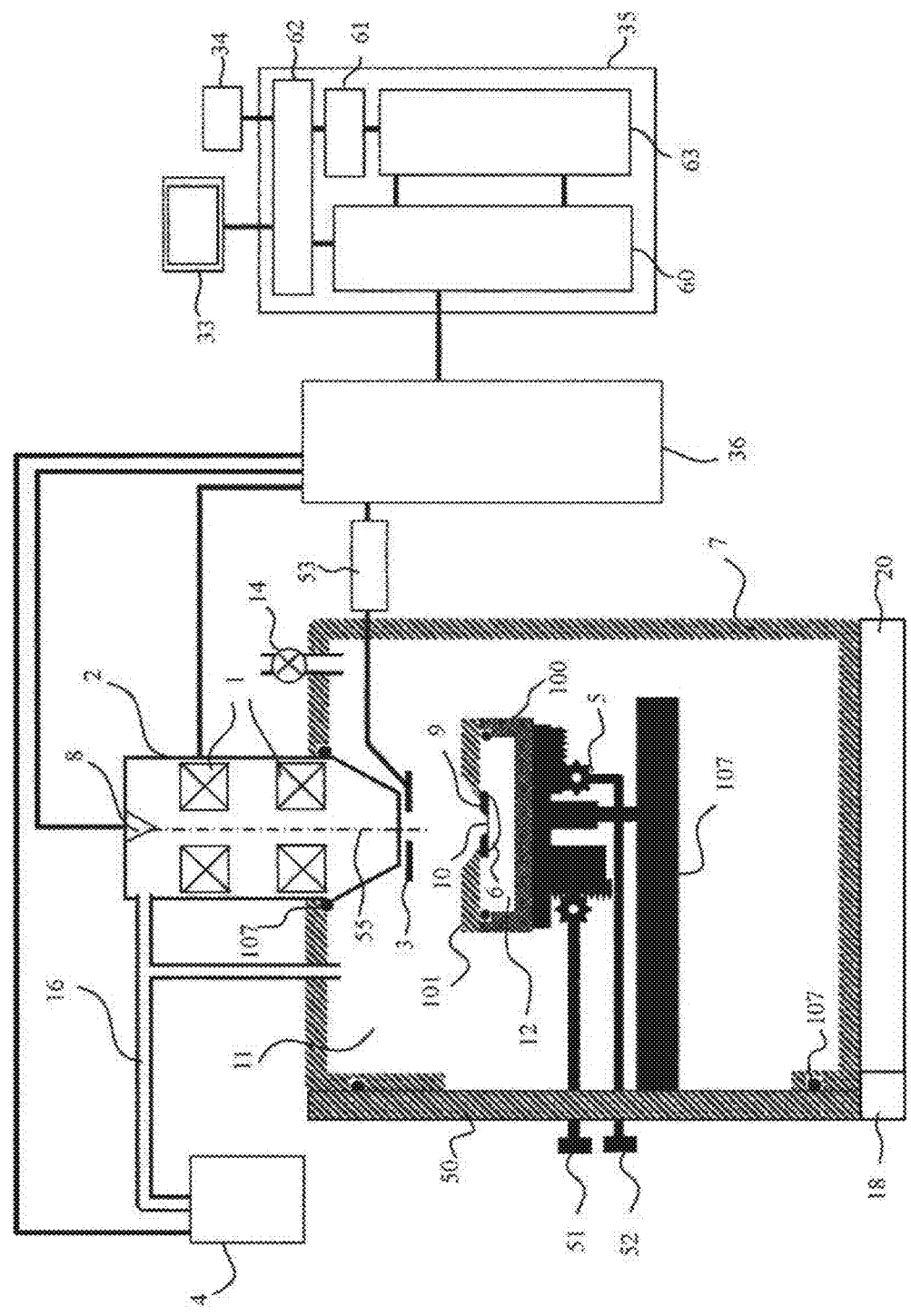
[Fig. 20]

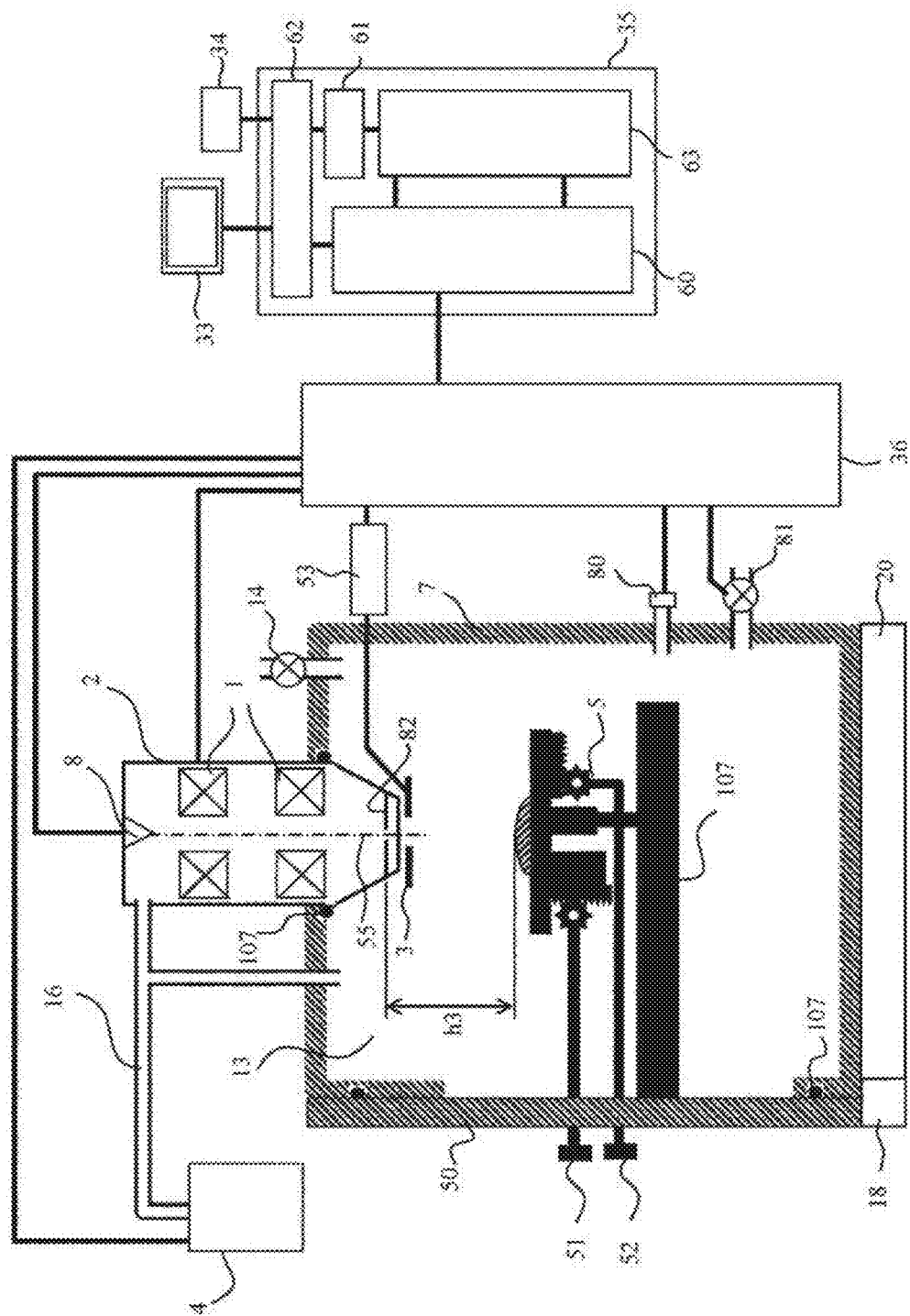
[Fig. 22]

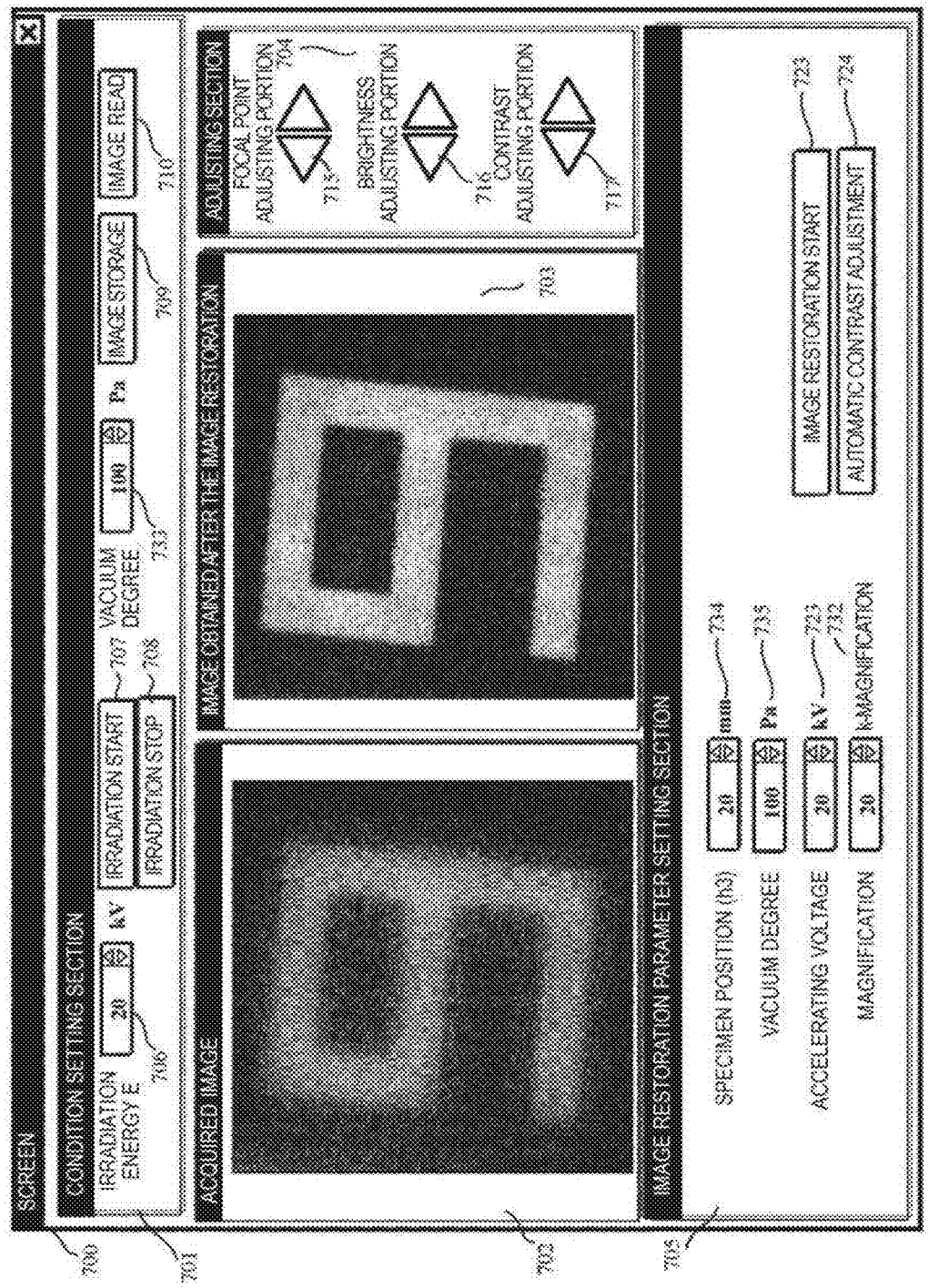
[Fig. 23]

CHARGED-PARTICLE-BEAM DEVICE, SPECIMEN-IMAGE ACQUISITION METHOD, AND PROGRAM RECORDING MEDIUM

TECHNICAL FIELD

The present invention relates to a charged-particle-beam device with which a specimen can be observed at atmospheric pressure, at desired gas pressure, or in a desired gas species.

BACKGROUND ART

In order to observe a fine region of an object, a scanning electron microscope (SEM), a transmission electron microscope (TEM), or the like, is used. In general, in these devices, a housing, in which a specimen is disposed, is subjected to vacuuming, an atmosphere of the specimen is in a vacuum state, and then the specimen is imaged. However, a biological or chemical specimen, a liquid specimen, or the like, is damaged, or a state thereof is changed, due to the vacuuming. On the other hand, there have been increased needs for observing such specimens by using an electron microscope and, recently, there has been a growing demand for an SEM device, in which an observation target specimen can be observed at atmospheric pressure, at desired gas pressure, or in a desired gas species.

Therefore, in recent years, a known literature discloses an SEM device in which a specimen can be disposed at atmospheric pressure, at a desired gas pressure, or in a desired gas species, by providing, between an electron optical system and the specimen, a barrier film or a fine hole that can transmit an electron beam, and thus, separating a vacuum state, in which the electron beam travels, from an atmosphere of a specimen. The known literature discloses the device in which an SEM observation can be performed at atmospheric pressure and a specimen position can be changed in a state in which the barrier film is not in contact with the specimen by using a specimen stage disposed immediately below the barrier film.

CITATION LIST

Patent Literature

PTL 1: JP-A-2012-221766

SUMMARY OF INVENTION

Technical Problem

In the case where the atmosphere of the observation target specimen is at atmospheric pressure, at a desired gas pressure, or in a desired gas species, a problem arises in that an electron beam is subjected to scattering due to an introduced barrier film, atmospheric gases, or an introduced gas, and thereby an unclear microscope image is obtained. For example, in a device that irradiates, with a charged-particle beam, a specimen mounted at atmospheric pressure in a state in which a barrier film is not in contact with the specimen, the charged-particle beam is subjected to scattering due to gas molecules in the atmosphere when a distance between the barrier film and the specimen is long, and thus an unclear microscope image is likely to be obtained. Hence, it is important that the barrier film and the specimen approach each other so as to reduce the amount of scattering due to the gas molecules in the atmosphere.

However, when the specimen and the barrier film approach each other too close, there is a concern that the barrier film will be damaged when the specimen is brought into contact with the barrier film.

In addition, PTL 1 proposes a method and device in which a light-element gas is introduced, thereby, reducing the scattering due to gas molecules between a barrier film and a specimen. The introduction of the light-element gas makes it possible to acquire a high-quality image in a state in which the barrier film and the specimen remain intact. However, a user needs to dispose a gas cylinder all the time and to discharge a gas whenever image observation is performed, and thereby time and effort is required for observation. Further, even when the light-element gas is introduced, there is no change in the scattering of an electron beam. As a result, it is commonly considered that a very low-quality image is obtained in a case where the specimen is observed using an electron microscope in a non-vacuum atmosphere, and thus, effective utilization of such a device is limited to some specific cases.

In summary, the problem arises in the method of the related art in that it is difficult to easily obtain a high-quality image by the effect of the scattering of the electron beam due to the gas molecules or the barrier film.

The present invention is made in view of the problem and thus, an object thereof is to easily acquire an image in which the effect of scattering of an electron beam due to a gas or a barrier film is reduced when an atmosphere around an observation target specimen is in a desired non-vacuum state such as in the atmosphere.

Solution to Problem

In order to solve the above problem, according to the present invention, there is provided a charged-particle-beam device including: a charged-particle optical lens tube that is subjected to vacuuming inside; a specimen stage on which a specimen is mounted in a non-vacuum space; a detector that detects secondary charged particles obtained by irradiation of the specimen with a primary charged-particle beam emitted from the charged-particle optical lens tube; and a data processing unit that removes, from a detector signal, the effect that scattering of the primary charged-particle beam before the primary charged-particle beam reaches the specimen has on the spot shape of the primary charged-particle beam.

Advantageous Effects of Invention

According to the present invention, it is possible to acquire a high-quality image without using a specific gas when an atmosphere around an observation target specimen is in a desired non-vacuum state such as in the atmosphere.

Another problem, configuration, or effect different from those described above is clearly described in the following embodiments.

BRIEF DESCRIPTION OF DRAWINGS

FIG. 1 shows a mean free route of a charged-particle beam at atmospheric pressure.

FIG. 2 shows an image acquired by a charged-particle microscope.

FIGS. 5A and 5B show the image acquired by a charged-particle microscope and an image subjected to image processing.

FIG. 6 is a view showing a configuration of a charged-particle microscope of Example 1.

FIGS. 8A and 8B are views showing the vicinity of the barrier film and the specimen in Example 1.

FIG. 9 shows an operation screen in Example 1.

FIG. 10 is a view showing performing flow in Example 1.

FIG. 11 is a view showing data transmission and reception in Example 1.

FIG. 12 is a view illustrating a fundamental principle,

FIG. 13 shows an operation screen in Example 1,

FIG. 14 shows an operation screen in Example 1.

FIG. 15 is a view showing a configuration of a charged-particle microscope of Example 2.

FIG. 16 is a view showing a configuration of a charged-particle microscope of Example 3.

FIGS. 17A and 17B are views showing a configuration of a charged-particle microscope of Example 4.

FIG. 19 is a view showing a configuration of a charged-particle microscope of Example 5.

FIG. 20 is a view showing a configuration of a charged-particle microscope of Example 5.

FIG. 22 is a view showing a configuration of a charged-particle microscope of Example 6.

FIG. 23 shows an operation screen in Example 7.

DESCRIPTION OF EMBODIMENTS

Figure 3A:
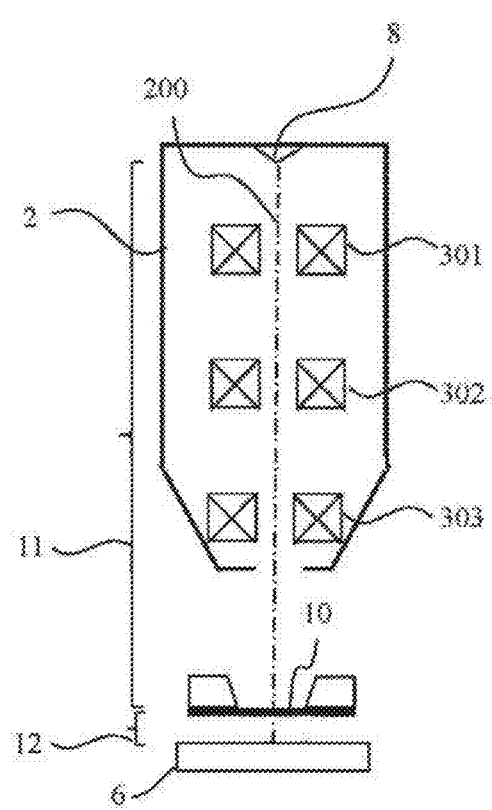
FIGS. 3A and 3B are views showing a fundamental principle.

Hereinafter, respective embodiments will be described with respect to the drawings.

Hereinafter, as an example of a charged-particle-beam device, a charged-particle microscope will be described. However, the charged-particle microscope is simply an example of the present invention and the present invention is not limited to the following embodiments to be described below. The present invention can also be applied to a scanning electron microscope, a scanning ion microscope, a scanning transmission electron microscope, a composite device of the microscopes and a specimen processing device, or an analysis and inspection device to which the above devices are applied.

In addition, "atmospheric pressure" in the present specification is the atmosphere or a predetermined gas atmosphere and means a pressure environment in an atmospheric pressure state or a slightly negative pressure state. Specifically, the atmospheric pressure is about $10^5$ Pa (atmospheric pressure) to $10^3$ Pa.

<Description of Fundamental Principle>

In a charged-particle-beam device in which observation can be performed at atmospheric pressure, a specimen and a barrier film need to approach each other. Results calculated by the present inventors are shown in FIG. 1 as a relation between an accelerating voltage of a charged-particle beam and a mean free route of the charged-particle beam at 1 atmosphere. The mean free path means an average value of distances by which the charged-particle beam travels without being interrupted by being scattered. For example, in a case of the accelerating voltage of 100 kV, the mean free route is about 200 μm. As will be described below, there is a non-scattered charged-particle beam that is not scattered but travels to have a mean free path equal to or greater than the mean free route, and that contributes to resolution of a microscope image. Therefore, in a case where a specimen is actually observed in the atmosphere using a charged-particle-beam microscope, it is found by tests that a distance between the barrier film and the specimen can be several times to about five times the mean free route shown in FIG. 1. In other words, in a case where the accelerating voltage of the charged-particle beam is in a range of 1 kV to about 100 kV, the distance between the specimen and the barrier film needs to be equal to or shorter than about 1,000 μm.

FIG. 2 shows a test result in which an observation target specimen mounted in the atmosphere is observed using a scanning electron microscope. The accelerating voltage is 15 kV and the distance between the barrier film and the specimen is 70 μm. The specimen has a portion of a character "9" which is formed of metal and the other portion formed of Si. An A portion and a B portion in the drawing are formed of the same material but have different image brightness. The B portion is observed to be brighter than the A portion. In addition, the periphery of the character "9" looks blurred. On the other hand, it is possible to distinctly recognize the edge of the character "9".

In general, in an electron microscope, in a case where a certain one point is irradiated with a beam, no signal is detected from a region except for an irradiated region. With this as a premise, in general, the beam-irradiated point is scanned on the specimen, and an image having a field of view which is sufficiently greater than a size of a beam shape is acquired. In other words, a brightness value of one point on the acquired image corresponds to the amount of detection of secondary charged particles when a spot corresponding to the point on the specimen is irradiated with the beam. Hence, in a case where the specimen in FIG. 2 is observed using an electron microscope having a high-vacuum specimen chamber in the related art, the portion of the character "9" is bright and the other portion is dark, and the brightness of the A portion and the B portion is not substantially changed. However, in the case of an SEM image in FIG. 2, the B portion is observed to be brighter than the A portion. The image as shown in FIG. 2 is not acquired by using a common electron microscope. A signal is detected from a portion other than the B portion in a state in which the B portion is irradiated with an electron beam. When a region of the B portion is irradiated with the electron beam, a signal is detected from the portion other than the B portion, and thereby it is inferred that the region other than the B portion is actually irradiated with a part of the electron beam. In other words, the size of the beam shape, with which the specimen is irradiated, is actually close to the size of the field of view. This phenomenon will be described below.

Figure 3B:
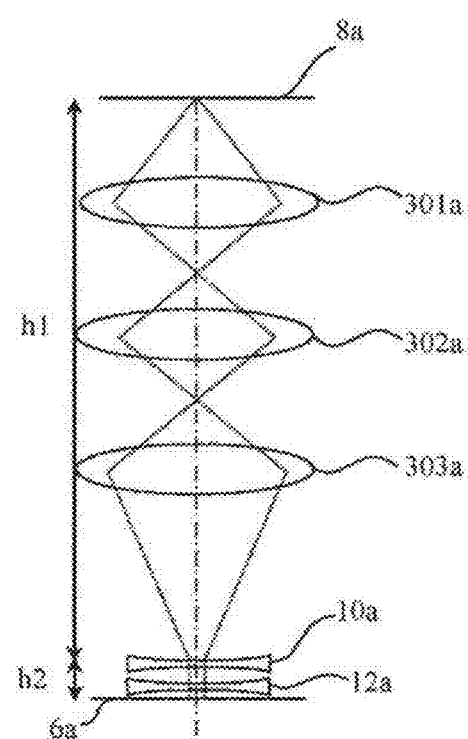

The common components of the charged-particle-beam device, in which observation is performed at atmospheric pressure, are described with reference to FIG. 3. FIG. 3(*a*) is a conceptual view showing a configuration of the charged-particle microscope. There is provided a charged-particle optical component such as a condensing lens or an object lens, which can generate an electromagnetic field in a charged-particle optical lens tube 2 having a charged-particle source 8. A space 11 from the charged-particle source 8 to the top surface of a barrier film 10 in the drawing is in vacuum. In addition, a space 12 from the under surface of the barrier film 10 in the drawing to a specimen 6 is a non-vacuum space in the atmosphere or in a desired gas atmosphere. Hereinafter, the distance of the non-vacuum space indicates a length of a path along which the charged-particle beam passes through the non-vacuum space, that is, a length in a charged-particle-beam direction, if not noted. Since, in general, irradiation with the charged-particle beam is performed to be perpendicular to the barrier film 10, the distance between the barrier film and the specimen is the distance of the non-vacuum space. FIG. 3(*b*) shows a view of this configuration depicted in a simplified manner. When a plane, from which charged particles are discharged, is referred to as an object plane 8*a*, a lens 301, a lens 302, and a lens 303 correspond to focusing lenses 301*a*, 302*a*, and 303*a* on which the charged-particle beam can focus. Meanwhile, the portion of the barrier film portion 10 and the space 12 in the non-vacuum atmosphere can be referred to as a scattering lens 10*a* and a scattering lens 12*a* which scatter the charged-particle beam, respectively.

Here, the length (a focal position of the object lens from the charged-particle source) of an optical lens tube of the charged-particle microscope depends on the accelerating voltage and, in general, about 10 mm to 1,000 mm. In general, the more the acceleration voltage is increased, the longer the length of the optical lens tube, due to necessity of focusing the charged-particle beams. In other words, when the length of the optical lens tube is h1, and the distance between the barrier film and the specimen is h2, the following relationship is satisfied.

$$h1/h2 \geq 1{,}000 \qquad \text{(Expression 1)}$$

Hence, actually, the distance h2 between the barrier film and the specimen is very smaller, compared to h1, than that shown in FIG. 3 (*b*). In other words, this configuration has significant characteristics in that two very-thin scattering lenses are introduced between the focusing lens 303*a* and the specimen surface 6*a*.

Charged particles after passing through the barrier film include charged particles which are scattered in the barrier film and charged particles which are not scattered in the barrier film. The amount of scattering of the charged-particle beam in the barrier film depends on a material type m, density ρ, and a thickness t of the barrier film 10. The charged particles after passing through the barrier film are incident to the space 12 in a non-vacuum atmosphere. The charged particles incident to the space 12 in the non-vacuum atmosphere are scattered due to a gas in the atmosphere. Even in this case, there are charged particles which can travel without being scattered. The amount of scattering of the charged-particle beam in the space in the non-vacuum atmosphere depends on a distance z (h2 in FIG. 3) from the barrier film 10 to the specimen 6, a gas species a in the non-vacuum atmosphere, and a gas pressure P (or density). In addition, the amount of scattering in the barrier film and the non-vacuum atmosphere also depends on irradiation energy E (also referred to as the accelerating voltage) of the charged-particle beam. For example, as shown in FIG. 1, the higher the accelerating voltage, the more the mean free route is increased, that is, the less the charged particles are likely to be scattered. In summary, when the two scattering lenses representing the barrier film and the space in the non-vacuum atmosphere are put in one scattering lens function (or, degradation function) A, the scattering lens function is described as follows.

$$A = A(m, \rho, t, a, P, z, E) \qquad \text{(Expression 2)}$$

In addition, in a case where F represents a shape of the charged-particle beam before the charged-particle beam passes through the barrier film and the space in the non-vacuum atmosphere, and G represents a shape of the charged-particle beam after the charged-particle beam passes through the barrier film and the space in the non-vacuum atmosphere, the following expression is established.

$$G = A(m, \rho, t, a, P, z, E) \times F \qquad \text{(Expression 3)}$$

As described above, there is a charged-particle beam which travels without being scattered once due to the barrier film or the non-vacuum atmosphere even when the charged-particle beam passes through the scattering lens function. In order to describe this mode, with reference to FIG. 4(*a*), scattering of the charged-particle beam in a barrier film 10*a* and in a space 12*a* in the non-vacuum atmosphere is described. A beam 305 represents a shape of a beam immediately before the beam is incident to the barrier film 10*a*. Then, when the beam is transmitted through the barrier film 10*a*, multiple charged particles are scattered in the barrier film and in the non-vacuum atmosphere. On the other hand, there are also charged particles that can travel without being scattered once. Hereinafter, the charged particles that can travel without being scattered due to the barrier film and the gas in the non-vacuum atmosphere are referred to as "non-scattered charged particles", and the charged particles scattered once or more are referred to as "scattered charged particles". As a result of scattering of the beam in this manner, the beam shape when the beam reaches the specimen 6 appears like 306. In the drawing, the transverse direction represents a distance (that is, spatial distance on the specimen surface) indicating a beam shape, and the longitudinal direction represents the number of charged particles. The beam 306 is formed of a beam 307 configured of the non-scattered charged particles, and a beam 308 configured by the scattered charged particles.

Figure 4B:
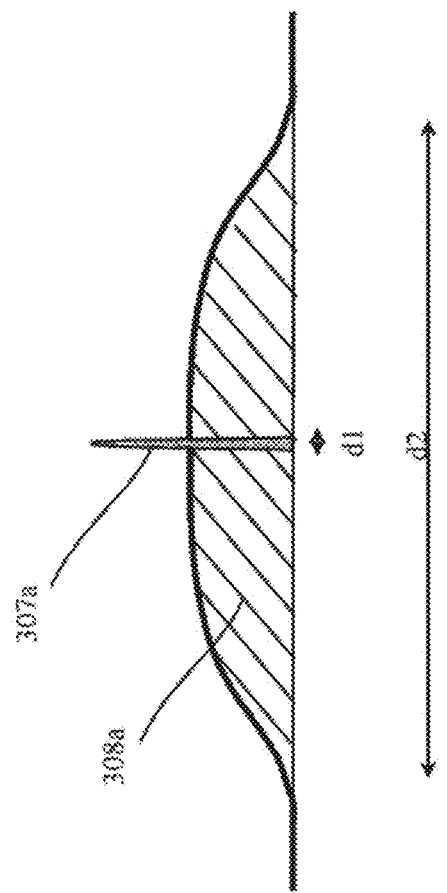
FIGS. 4A and 4B are views showing the fundamental principle.
Figure 4A:
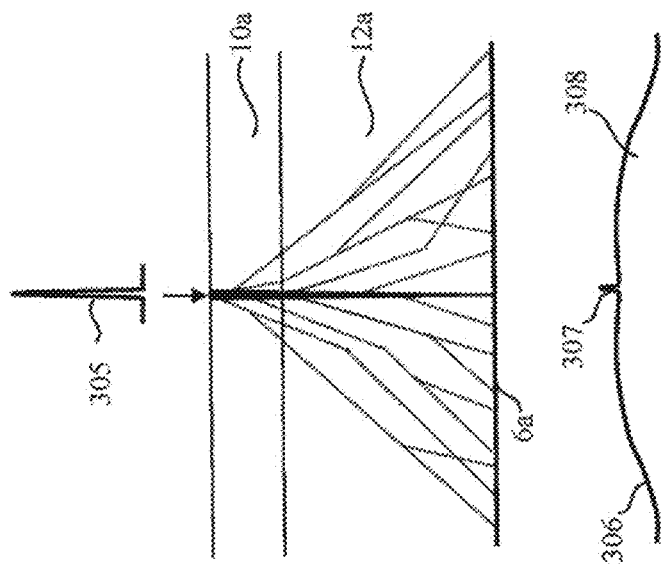

FIG. 4 (*b*) shows an enlarged beam shape. When N0 represents the number of non-scattered charged particles and N1 represents the number of scattered charged particles, the number N0 of non-scattered charged particles corresponds to a portion (area) of an inside 307*a* of the beam shape, and the number N1 of scattered charged particles corresponds to a portion (area) of an inside 308*a* of the beam shape. In other words, in a charged-particle microscope device in which the specimen 6 is disposed in the atmosphere, the beam 305 focused on an optical lens has a shape represented by the beam 306 immediately before the beam reaches the specimen. When d0 represents a beam diameter of the incident charged-particle beam, and d1 represents a beam diameter of non-scattered charged particles, and d2 represents a beam diameter of scattered charged particles, a function of the diameters is as follows.

$$d2 > d0 \sim d1 \qquad \text{(Expression 4)}$$

Since the beam diameter d0 of the incident charged-particle beam and the beam diameter d1 of the non-scattered charged-particle beam are substantially the same, the resolution of an acquired microscope image is determined by the beam diameter d1 of the non-scattered charged particles. In other words, when only the beam 307 remains, that is, to put it in other description, when the number of non-scattered charged particles sufficiently remains, the resolution is to be maintained. The beam diameters represented by d0, d1, and d2 above may be defined by, specifically, a diameter, a radius, a half width, or the like, of the beam, when the definition of the beam diameter is the same. Hereinafter, the shape or the spot shape of the beam indicates parameters representing the size of the diameter of the beam.

Next, the sizes of d1 and d2 are described. In general, the beam diameter (d1) of the charged-particle beam is about 1 nm to 100 nm at the maximum. In addition, the beam diameter (d2) of the scattered charged-particle beam depends on a material or a thickness of the barrier film and a parameter such as a distance when the beam is scattered due to a gas, and the beam diameter is typically about 10 nm to 10,000 nm. The more the distance Z between the barrier film and the specimen is increased, the more the amount of the scattering is increased. Therefore, d2 may become significantly longer than 10,000 nm. As above, in the case where a problem arises in the scattering of the charged-particle beam, the following expression is established.

$$d2/d1 \geq 10 \quad \text{(Expression 5)}$$

Based on the above description, it is possible to describe the acquired electron microscope image in FIG. 2, in terms of the scattered charged particles described in FIG. 4. In other words, when the B portion in FIG. 2 is irradiated with an electron beam, it can be considered that the portion of the character "9" is also irradiated with the beam 308 formed of the scattered electrons. By comparison, since the A portion is at a distance from the character "9", the portion of the character "9" is not irradiated with the beam 308 when the A portion is irradiated with the electron beam, and the A portion is observed to be darker than the B portion. Meanwhile, since the resolution is maintained due to the beam 307 formed of non-scattered electrons, it can be considered that the edge of the character "9" is clearly observed.

As in (Expression 5), this phenomenon occurs when the beam diameter of the scattered charged-particle beam is significantly increased, compared to the beam diameter of the non-scattered charged-particle beam. As a result, the specimen is irradiated in a wide range with the scattered charged-particle beam. Accordingly, an occurrence of the effect of scattering of the charged particles in a wide range is a characteristic phenomenon when the specimen is irradiated with the charged-particle beam in non-vacuum surroundings, but this phenomenon does not occur in the electron microscope having a vacuum specimen chamber in the related art.

In the above phenomenon and description, the inventors find that the barrier film and the non-vacuum atmosphere represented by very thin scattering lenses disposed between the charged-particle optical lens tube 2 and the specimen 6 cause the spot shape of the primary charged-particle beam to be changed, and the resolution of the image is maintained as long as the non-scattered charged-particle beam 307 remains. In addition, as shown in (Expression 1), since factors causing the beam to be scattered are very spatially concentrated, it is possible to logically calculate the change in the beam shape in the space. In other words, the scattering lens function A in (Expression 2) is obtained by calculation or a simulation, and it is very easy to calculate a beam shape G after the scattering. This is very important also in terms of image restoration to be described below.

<Image Restoration>

The image restoration in the following description means a process of restoring resolution or image quality from degradation, by performing some arithmetic processing on an acquired image. In addition, the image restoration in the following description includes not only a case where the arithmetic processing is performed to restore the acquired image, but also a case where the arithmetic processing is performed on a signal output from a detector and an image is generated in response to the processed signal.

In an electron microscope for observing a specimen in vacuum, a method of image restoration using the beam shape obtained in tests is known in the related art. For example, convolution of the degradation function A such as degradation of the resolution with an ideal image F on which no noise or degradation of resolution occurs, and noise n is superimposed on the convolution, and thereby a model of an acquired image G is obtained as follows.

$$G = A \cdot F + n \quad \text{(Expression 6)}$$

In this function, the ideal image F is calculable from the acquired image G and the degradation function A. This is called the image restoration. This correspondence relationship is the same as in (Expression 3). In other words, the degradation function A indicating the degradation of the beam shape is obtained and deconvolution processing is performed on the shape, thereby making it possible to perform the image restoration. However, calculation of the ideal image F using the beam shape scattered in the atmosphere, at a desired gas pressure, or in a desired gas species, has not been performed until the present day. It is considered that this is because it is impossible to control a region in which scattering is performed. However, as described above, in the case of the electron microscope in which observation can be performed at atmospheric pressure, it is possible to consider the very thin scattering lens as a factor of degradation of image quality, and the factors which are used to determine a degree of degradation of a beam shape are very locally concentrated in the space from the barrier film and the specimen. As a result, parameters that determine the scattering lens function which determines the beam shape are only parameters due to the barrier film and the space in the non-vacuum atmosphere, and the parameters can be controlled. Therefore, it is very easy to obtain the degradation function A required for the image restoration. This is one of the important features in the present invention.

Of the parameters of the scattering lens function A (degradation function A), the material type M, density p, and a thickness t of the barrier film 10 are known in advance because the known barrier film is used in the device. In other words, it is possible to calculate the amount of scattering in the barrier film in advance. In addition, as will be described below, the accelerating voltage of the charged-particle beam, the gas species and the pressure in the non-vacuum atmosphere, and the distance of the space in the non-vacuum atmosphere are designated by a user of the device, and thus, can be known. In other words, from these observation conditions, it is possible to obtain, in advance, a ratio between the number N0 of non-scattered charged particles and the number N1 of scattered charged particles, values of the beam diameter d1 of the non-scattered charged particles and the beam diameter d2 of the scattered charged particles, and the beam shape thereof. As a result, only the beam 307a formed of the non-scattered charged particles remains and it is possible to remove, from an image signal, the effect of the beam 308a formed of the scattered charged particles. In this manner, as will be described below, the ideal image F is calculable using the beam shape scattered in the atmosphere, at a desired gas pressure, or in a desired gas species atmosphere, thereby making it possible to perform the image restoration, which has not been performed until the present day. Here, the term, "remove", means not only a case of complete removing, but also a case of removing a part of the effect due to the scattered charged particles, and of reducing the effect due to the beam degradation on the image.

The beam shape as a target of the image restoration process has the shape 306 as shown in FIG. 4 (a). Hence, as a model of the scattering lens function A in (Expression 6), a sum of a first waveform 307a configured to have a width d1 and a second waveform 308b configured to have a width d2 as in FIG. 4(b) may be used. The first waveform 307a represents the spot shape of the non-scattered charged-particle beam and the second waveform 308b represents the spot shape of the scattered charged-particle beam. Since some scattered charged-particle beams are subjected to scattering again, it is not possible to simply describe the spot shape by the sum of the two waveform distributions. In this case, a condition, in which the number N of incident electrons becomes constant, is maintained, and a beam shape may be formed by the sum of a plurality of waveforms d1, d2, d3, . . . , and dn. The waveform described above has, for example, the Gaussian distribution; however, the beam shape may be formed by the sum of any waveforms. When the model of the scattering lens function A is determined, it is possible to confirm the scattering lens function A by the parameters of m, ρ, t, a, P, z, and E described above in (Expression 2). Deconvolution processing is performed on the acquired image G using the confirmed scattering lens function A, thereby making it possible to restore the ideal image F.

One of the important features of the present invention is that a method, in which it is considered that the waveforms are divided into two (or more) waveforms of the non-scattered charged particles and scattered charged particles, so as to find that it is possible to form the degraded beam shape (that is, the model of the scattering lens function) obtained when the non-scattered charged particles and scattered charged particles reach the specimen by adding the waveforms representing the respective non-scattered and scattered charged particles, when the arithmetic processing is performed for the image restoration. In FIG. 5, images obtained before and after the image restoration processing described above are compared. FIG. 5(a) shows the image obtained before the image restoration, and FIG. 5(b) shows the image obtained after the image restoration. FIG. 5 shows a result in which, in a case where the observation conditions satisfy (Expression 5), the acquired image shown in FIG. 2 is restored by the deconvolution processing as described above, with the sum of the non-scattered charged-particle beam and the charged-particle beam as the model of the scattering lens function A. It is checked that it is possible to significantly reduce, by the image restoration, the blur in the brightness on the periphery of the character "9" due to the scattered electrons. In addition, it is possible to also clearly observe the edge of the character "9".

In the image restoration, it is important to understand the parameters of the scattering lens function and then to perform the image restoration processing. Hereinafter, the charged-particle-beam device which performs the image restoration and a method of the image processing will be described based on the parameters of the scattering lens function described above. As described below 000, a user may input the accelerating voltage of the charged-particle beam, the gas species and the pressure in the non-vacuum atmosphere, a ratio between the number N0 of non-scattered particles and the number N1 of scattered charged particles according to the distance of the space in the non-vacuum atmosphere, and values of the beam diameter d1 of the non-scattered charged particles, and the beam diameter d2 of scattered charged particles. In addition, the effect of the scattering is calculated in advance and then, the shape that the beam 306 has when the beam reaches the specimen is obtained and is stored in a storage unit in a computer. Then, the deconvolution processing is performed on the signal acquired from the detector using data stored in the storage unit, and thereby the image restoration may be automatically performed.

The image restoration method based on the scattering lens function described above is very effective for a device including a charged-particle optical system in which objects that can be considered as scattering lenses are disposed to be locally concentrated. Specific embodiments of such a device are described in the following Examples; however, application of the present invention is not limited to the following Examples.

Example 1

<Description of Configuration of Basic Device>

In the present example, a basic embodiment is described. FIG. 6 is a view of an entire configuration of a charged-particle microscope according to the present example.

The charged-particle microscope illustrated in FIG. 6 is configured to mainly include the charged-particle optical lens tube 2, a housing (vacuum chamber) 7 which is connected to and supports the charged-particle optical lens tube 2, a specimen stage 5 disposed in the atmosphere, and a control system which controls the above components. When the charged-particle microscope is used, the insides of the charged-particle optical lens tube 2 and the housing 7 are subjected to vacuuming by a vacuum pump 4. Start and stop operations of the vacuum pump 4 are also controlled by the control system. In the drawings, only one vacuum pump 4 is illustrated; however, two or more vacuum pumps may be provided. The charged-particle optical lens tube 2 and the housing 7 are supported by columns or a base (not shown).

The charged-particle optical lens tube 2 is configured to include elements such as the charged-particle source 8 which generates a charged-particle beam, and an optical lens 1 which causes the generated charged-particle beam to focus and to be guided to a lower section of the lens tube, and scans the specimen 6 with a primary charged-particle beam. The charged-particle optical lens tube 2 is disposed to protrude to the inside of the housing 7 and is fixed to the housing 7 through a vacuum sealing member 123. At the end of the charged-particle optical lens tube 2, a detector 3, which detects secondary charged particles (secondary electrons or reflective electrons) that are obtained by irradiation of the primary charged-particle beam described above, is disposed. The detector 3 may be disposed inside or outside of the charged-particle optical lens tube 2. The charged-particle optical lens tube may include another lens, another electrode, or another detector different from those described above, a part of a configuration may be different from that described above, and the configuration of the charged-particle optical system included in the charged-particle optical lens tube is not limited thereto.

The charged-particle microscope of the present example includes, as a control system, a computer 35 which is used by a device user, a control unit 36 which is connected to the computer 35, transmits and receives an instruction, and controls a vacuuming system, a charged-particle optical system, or the like, in response to the instruction from the computer 35. The computer 35 includes a monitor 33 on which an operation screen (GUI) of the device is displayed and input means to the operation screen, such as a keyboard or a mouse. The control unit 36 and the computer 35 are connected through various communication cables.

The control unit 36 is a section which transmits and receives a control signal for controlling the vacuum pump 4, the charged-particle source 8, the optical lens 1, or the like, and further, the control unit converts an output signal of the detector 3 into a digital image signal and causes the digital image signal to be displayed on the screen 33 through the computer 35. An image generated in the control unit 36 is displayed on the monitor 33 of the computer 35. In the drawings, the output signal from the detector 3 is transmitted to the control unit 36 through an amplifier 154 such as a preamplifier is connected to the control unit 36. If the amplifier is not necessary, the amplifier may not be provided.

The control unit 36 may include both an analog circuit and a digital circuit together, or may be configured to have two or more control units 36. The charged-particle microscope may include another control unit which controls operations of the respective components in addition to the control unit described above. The control unit 36 may be configured as hardware by a dedicated circuit board or may be configured as software which is executed by a computer 35. In a case where the control unit is configured as hardware, the control unit can be realized by a plurality of computing units that perform processing, and are mounted on an interconnection substrate, or by being integrated in a semiconductor chip or a package. In a case where the control unit is configured as software, a high-speed general-purpose CPU is mounted on the computer and the control unit can be realized by executing a program which performs a desirable computing process. Further, the configuration of the control system illustrated in FIG. 6 is only an example, modification examples of a control unit, a valve, a vacuum pump, or a communicating cable belong to a category of the SEM to the charged-particle-beam device of the present example, as long as the modification examples perform an intended function in the present example.

The vacuum pipe 16 having one end connected to the vacuum pump 4 is connected to the housing 7 and the inside thereof is maintained to be in the vacuum state. Meanwhile, a leak valve 14, which opens the inside of the housing to the atmosphere, is provided and it is possible to open the housing 7 to the atmosphere during the maintenance or the like. The leak valve 14 may not be provided or two or more leak valves may be provided. In addition, a position of the housing 7, at which the leak valve 14 is disposed, may be changed to another position on the housing 7 without being limited to the positions illustrated in FIG. 6.

The barrier film 10 is provided at a position immediately below the charged-particle optical lens tube 2 described above on the under surface of the housing. The barrier film 10 can transmit or allow the primary charged-particle beam, which is released from the lower end of the charged-particle optical lens tube 2, to pass and the primary charged-particle beam eventually reaches the specimen 6 mounted on a specimen base 52 through the barrier film 10. A closed space (that is, the insides of the charged-particle optical lens tube 2 and the housing 7), which is configured to have the barrier film 10, can be subjected to vacuuming. Since the specimen is disposed in the non-vacuum space, the barrier film 10 needs to be capable of maintaining the differential pressure between the vacuum space and the non-vacuum space. In the present example, since the space which is subjected to vacuuming is maintained in a sealed state by the barrier film 10, it is possible to maintain the charged-particle optical lens tube 2 in the vacuum state and it is possible to maintain and observe the specimen 6 in the atmospheric pressure. In addition, since the space, in which the specimen is disposed, is in the atmosphere even in a state in which irradiation is performed with the charged-particle beam or the space communicates with a space in the atmosphere, it is possible to freely replace the specimen 6 during the observation.

The barrier film 10 is formed or deposited on the base 9. The barrier film 10 is formed of a carbon material, an organic material, a metal material, silicon nitride, silicon carbide, silicon oxide, or the like. The base 9, for example, is a silicon or metal member. The barrier film 10 section may have multiple-arranged windows. A thickness of the barrier film which can transmit or allow the primary charged-particle beam to pass is about several nm to several µm. The barrier film needs not to be damaged under the differential pressure for separating the atmospheric pressure from the vacuum. Therefore, an area of the barrier film 10 is about tens µm to several mm at most in size. The barrier film 10 may not have a square shape, but may have a rectangular shape or the like. The barrier film may have any shape. The base, on which the barrier film 10 is prepared, is formed of silicon, a film of a barrier-film material is formed on the silicon, and then the film is subjected to wet-etching processing. Then, areas of the upper side and the lower side of the barrier film are different from each other as shown in the drawing. In other words, an area of an opening on the upper side of the base 9 in the drawing is greater than the area of the barrier film.

The base 9 supporting the barrier film 10 is provided on a barrier film holding member 155. Although not shown in the drawing, the base 9 and the barrier film holding member 155 adhere to each other by an O-ring, packing, an adhesive, a double-sided tape, or the like which can be vacuum sealed. The barrier film holding member 155 is detachably fixed to the under surface side of the housing 7 through a vacuum sealing member 124. Since the barrier film 10 is very thin to have a thickness equal to or less than about several nm to several µm, in order to satisfy a demand of transmitting the charged-particle beam, the barrier film can be damaged due to degradation with time or during preparation of the observation. In addition, since the barrier film 10 and the base 9 supporting the barrier film are small, it is very difficult to directly handle the barrier film and the base. Therefore, as in the present example, the barrier film 10 and the base 9 are integrated with the barrier film holding member 155, the base 9 is handled through the barrier film holding member 155 without directly touching the base, and thereby it is very easy to handle (particularly, replace) the barrier film 10 and the base 9. In other words, in a case where the barrier film 10 is damaged, the barrier film may be replaced, together with the barrier film holding member 155. Even though the barrier film 10 needs to be directly replaced, it is possible to pull the barrier film holding member 155 out to the outside of the device and it is possible to replace the base 9 integrated with the barrier film 10 together on the outside of the device.

In addition, although not shown in the drawing, an optical microscope with which a specimen can be observed may be disposed immediately below or in the vicinity of the specimen 6. In this case, the barrier film 10 is positioned above the specimen and the observation using the optical microscope is performed below the specimen. Therefore, in this case, the specimen base 52 needs to be transparent with respect to light of the optical microscope. Examples of transparent materials include transparent glass, transparent plastics, transparent crystalline body, and the like. As a commoner specimen base, there is a transparent specimen base such as glass slide (or prepared slide) or a dish (or petri dish).

In addition, a temperature heater, a voltage applying unit that can generate an electric field in the specimen, or the like may be provided. In this case, it is possible to observe a mode in which the specimen is heated or cooled or a mode in which an electric field is applied to the specimen.

In addition, two or more barrier films may be disposed. For example, the barrier film may be disposed inside the charged-particle optical lens tube 2. Otherwise, a second barrier film may be provided below a first barrier film that separates the vacuum and the atmosphere, and the specimen may be enclosed between the second barrier film and the specimen stage.

In addition, as anther embodiment, the specimen may be observed by being placed in an environmental cell and being disposed on a specimen stage of a common high-vacuum charged-particle microscope. The environmental cell is a vessel that introduces the entirety of the specimen, which is enclosed in a sealed state, inside a vacuum device and that locally maintains an atmosphere in the vicinity of the specimen in the vacuum chamber. A specimen height adjusting mechanism may be provided inside the environmental cell. The image restoration processing described above is also effective for a case where the effect of scattering between the specimen and the barrier film for separating the vacuum and the local atmosphere in the environmental cell is removed. In the present invention, regardless of the number or types of barrier films, as long as the function intended in the present example is satisfied, any configuration belongs to a category of the SEM to the charged-particle-beam device of the present example.

In addition, although not shown in the drawings, a detector that can detect the charged-particle beam transmitted though the specimen 6 may be provided immediately below the specimen 6. The detector is a detecting element that can detect and amplify the charged-particle beam which travels with energy of several keV to tens keV. For example, a semiconductor detector made of a semiconductor material such as silicon, a scintillator or a luminescence light-emitting material that can convert a charged-particle signal into light on a glass surface or inside glass, a YAG (yttrium, aluminum, garnet) element, or the like is used as the detector. An electrical signal or an optical signal from the detector is transmitted to a control system configured to include a high-rank control unit 36 and a lower-rank control unit 37 through a wire, a light transmission path, or a photodetector. The detector, in which the specimen is directly or indirectly mounted, can detect a transmitted charged-particle signal. Hence, the detector, in which the specimen 6 is mounted, is caused to approach the barrier film 10, thereby making it possible to acquire a transmitted charged-particle-beam image of the specimen 6 in the atmosphere. In this case, it is also effective to use the image restoration method in the present example.

The specimen stage 5 disposed in the atmosphere is provided below the barrier film 10 provided in the housing 7. In this manner, the specimen is mounted in the atmosphere (non-vacuum space). The specimen stage 5 includes a Z-axial drive mechanism having a height adjusting function, which enables at least the specimen 6 to approach the barrier film 10. It is needless to say that an XY drive mechanism that moves in an in-plane direction of the specimen may be provided. Although not shown in the drawings, as a mechanism that adjusts a distance between the specimen 6 and the barrier film 10, instead of or in addition to the Z-axial drive mechanism that causes the specimen 6 to move, a drive mechanism that drives the barrier film 10 and the barrier film holding member 155 in a specimen direction (vertical direction in the drawing) may be provided. Otherwise, a drive mechanism that enables the charged-particle optical lens tube 2 or the vacuum housing 7 to move in the vertical direction may be provided and the charged-particle optical lens tube 2 or the entirety of the vacuum housing 7 may move to the specimen side. The mechanisms, which can change the distance between the barrier film and the specimen by enabling the barrier film, the specimen, or the charged-particle optical lens tube to move, are collectively referred to as a distance adjusting mechanism.

In the present example, energy E obtained when the charged-particle beam from the charged-particle-beam source 8 reaches the specimen is set and controlled. An irradiation energy control unit 59 is provided between the control unit 36 and the charged-particle optical lens tube 2. For example, the irradiation energy control unit 59 is a high-voltage power supply that can change a voltage supplied to the charged-particle-beam source 8 and thereby can change irradiation energy E of the charged-particle beam to the specimen. The irradiation energy control unit 59 may be provided inside the control unit 36. In addition, as another example, the irradiation energy control unit 59 may be an electrode that changes the accelerating voltage of the charged-particle beam from the charged-particle-beam source. In addition, the irradiation energy control unit may be a power supply that controls to change a voltage to an optical lens which can accelerate or decelerate the primary charged-particle beam. In addition, as still another example, the irradiation energy control unit may be a power supply that can apply a voltage to the specimen stage. Such a control system may be provided in the control unit 36 or may be provided between the control unit 36 and the optical lens 1. In addition, the specific examples of the irradiation energy control unit of the charged-particle beam may be used by being appropriately combined.

The computer 35 is configured to include a data transmitting/receiving unit 60, a data memory 61, an external interface 62, and a data processing unit 63. The data transmitting/receiving unit 60 transmits and receives various types of data such as reception of a detection signal. The data memory 61 can store an image signal. The external interface 62 is connected to a user interface 34 such as the monitor 33, a keyboard, or a mouse. The data processing unit 63 converts the detection signal into the image signal and outputs the image signal. Further, in the present example, the data processing unit 63 performs processing of removing the effect that scattering of the primary charged-particle beam before the primary charged-particle beam reaches the specimen on the spot shape, that is, the image restoration processing. In the present example, the primary charged-particle beam is scattered due to the barrier film and the atmosphere between the barrier film and the specimen. The parameters of the scattering lens function for the image restoration can be input using the user interface 34. The data processing unit 63 obtains a beam shape formed of the non-scattered charged particles and the scattered charged particles using the parameters of the scattering lens function. As described above, the amount of scattering due to the barrier film can be obtained with the material type, the density, and the thickness of the barrier film, and the amount of scattering due to the atmosphere between the barrier film and the specimen can be obtained with the distance between the barrier film and the specimen, and the gas species and the pressure in the atmosphere. The effect on the spot shape of the primary charged-particle beam can be obtained based on the amounts of the scattering obtained in this manner. Then, the image restoration processing as described above is performed on the acquired image or on the image signal which is currently acquired, and the effect on the spot shape due to the scattering is removed. As a result, it is possible to display, on the monitor 33, a microscope image from which the effect of the scattered charged particles is reduced. In a case where there is no need to input the parameters when the parameters of the scattering lens function are known in advance, the beam shape may be obtained using a correspondence relationship between the image acquisition conditions stored in advance and the parameters of the scattering lens function. Specifically, a correspondence table between the image acquisition conditions and the parameters of the scattering lens function is stored in the data memory 61, and the image acquisition conditions are automatically read. Then, the parameters of the scattering lens function which correspond to the image acquisition conditions are automatically read from the correspondence table, the scattering lens function is confirmed, and the image restoration is performed using the function.

In a configuration shown in FIG. 6, when the same type of barrier film is used each time, the material type M, the density $\rho$, and the thickness t of the barrier film 10 are constant without a change. In addition, as long as the gas species and the pressure are used at atmospheric pressure, the gas species A and the pressure P in the non-vacuum space (atmospheric space) are almost constant. In other words, in FIG. 6, the factor that changes the parameters of the scattering lens function is, for example, only the distance Z between the barrier film 10 and the specimen 6. Hereinafter, a plurality of methods of obtaining the distance between the barrier film and the specimen will be described.

Figure 7B:
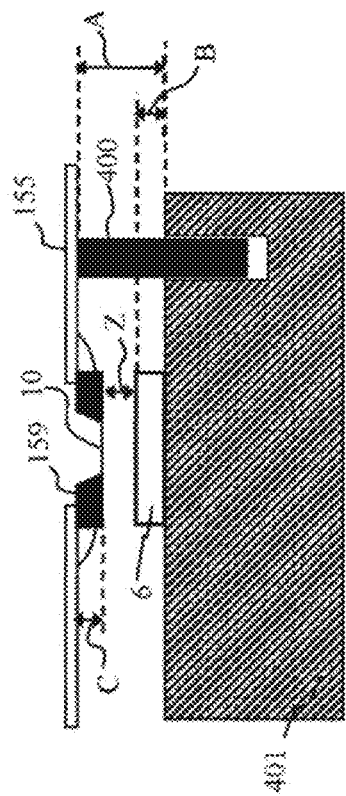
FIGS. 7A and 7B are views showing the vicinity of a barrier film and a specimen in Example 1.
Figure 7A:
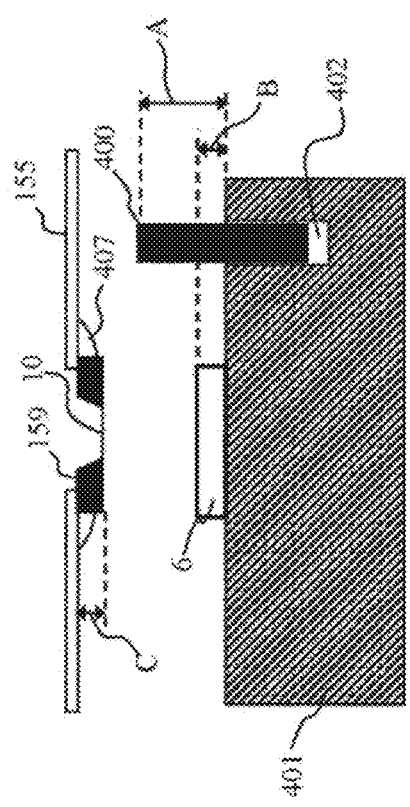

FIG. 7(a) is a view showing only the peripheral portion of the barrier film and the specimen. In the present example, a distance control member 400 is provided between the specimen 6 and the barrier film 10. The distance control member is provided to project from the specimen base, and the front end of the distance control member 400 is disposed on the barrier film side from the specimen 6 all the time, as shown in FIG. 7(a). Also, as shown in FIG. 7(b), in a state in which a position of a specimen base 401 approaches the barrier film 10 in the direction, the distance control member 400 comes into contact with the barrier film holding member 155. In this manner, it is possible to set the distance between the barrier film 10 and the specimen 6 to a constant value. Meanwhile, a height B of the specimen 6 is changed according to the specimen. Therefore, it is desirable to have an adjustment mechanism that can adjust a height A of the distance control member 400 according to the height of the specimen B. For example, the distance control member 400 is an external thread and the specimen base 401 side becomes an internal thread 402, thereby making it possible to change the height A of the distance control member 400 by rotating the thread portion of the distance control member 400. The adjustment mechanism may cause a position on the distance control member 400, at which the specimen comes into contact with the barrier film, to move in the optical-axis direction of the charged-particle optical lens tube.

In a case where B represents a distance (thickness of the specimen) form the specimen base 401 to the top surface of the specimen, and C represents a distance between the barrier film holding member 155 and the barrier film 10, the distance Z between the barrier film and the specimen in a case where the distance control member 400 comes into contact with the barrier film holding member 155 is obtained in the following expression.

$$Z=(A-B)-C \qquad \text{(Expression 7)}$$

As described above, it is desirable that the distance Z between the barrier film and the specimen becomes short in terms of the mean free route of the charged-particle beam. Specifically, the distance may be equal to or less than 1,000 µm. In addition, there is a need to satisfy the following expression in order not for the barrier film 10 to come into contact with the specimen 6.

$$A-B>C \qquad \text{(Expression 8)}$$

With the above relational expression, it can be assured that the distance between the specimen and the barrier film is Z when the distance control member is used.

Next, another configuration, in which a distance control member 408 is disposed, will be described with reference to FIG. 8. In this case, the distance control member 408 is provided on the base 9 that holds the barrier film 10. The distance control member 408 may be a thin film that is formed on the base 9 in advance, or may be a spacer or the like which is attached later. For example, when the specimen 6 comes into contact with the distance control member 408 having the known thickness, it is possible to obtain the distance Z between the barrier film and the specimen. Otherwise, after the contact, the specimen is again separated from the distance control member 408 by a known distance, thereby making it possible to control the distance between the specimen 6 and the barrier film 10.

In addition, although not shown in the drawings, the distance may obtain using a camera or the like in a lateral direction in the drawing of the device in FIG. 6. Otherwise, the distance between the barrier film and the specimen may be measured using a laser or the like. In addition, the distance between the specimen and the barrier film may be controlled by transmitting a signal from the data transmitting/receiving unit 400 to a drive control unit (not shown), and electrically driving the specimen stage or the like. Although not shown in the drawings, instead of causing the specimen 6 and the barrier film 10 to approach each other by moving the specimen stage 5 on which the specimen 6 is mounted, the specimen 6 and the barrier film 10 may approach each other by a drive mechanism that drives the barrier film 10 and the barrier film holding member 155 in the vertical direction in the drawing. Otherwise, when the height of the specimen 6 is measured at a position out of the present charged-particle-beam device, and the specimen height is known in advance, it is possible to obtain the distance between the barrier film 10 and the specimen 6 using the height of the specimen stage 5 even not using the methods described above.

<Operation Screen>

FIG. 9 shows an example of the operation screen. Here, an example, in which the image restoration is performed using the parameters input through the operation screen, is described.

An operation screen 700 includes a condition setting section 701 on which an observation condition is set, an image display section 702 on which an acquired image is displayed, an image display section 703 on which an image obtained after the image restoration is displayed, and an image adjusting section 704, an image restoration parameter setting section 705, or the like. The condition setting section 701 has an irradiation energy E setting portion 706, an irradiation start button 707, an irradiation stop button 708, an image storage button 709, an image read button 710, or the like. An image acquired before the image restoration is displayed in the image display section 702, and a restored image is displayed in the image display section 703. The image adjusting section 704 has a focal point adjusting portion 715, a brightness adjusting portion 716, a contrast adjusting portion 717, or the like.

The image restoration parameter setting section 705 is an input column on which the parameters related to a substance, which contributes to the scattering of the primary charged-particle beam, are input. Specifically, the image restoration parameter setting section has a barrier film-to-specimen distance setting portion 711, an accelerating voltage input portion 723 on which the accelerating voltage used when the image is acquired is input, a magnification setting portion 732, an image restoration start button 713, and a button that adjusts the brightness or the contrast of the restored image. Here, when information on the barrier film is known in advance, and the space between the barrier film and the specimen is in the atmosphere, setting of the barrier film-to-specimen distance Z, the accelerating voltage E, and the magnification makes it possible to calculate a scattered charged-particle-beam shape as shown in FIG. 4. It is needless to say that not only the barrier film-to-specimen distance Z, but also other parameters described above as the parameters related to the substance that contributes to the scattering of the primary charged-particle beam may be input. The setting of the magnification means that a size of one pixel (pixel size) that forms in an image and the number of pixels are determined. Instead of the magnification, it may be possible to input a pixel size.

The beam diameter d1 of the non-scattered charged-particle beam, the beam diameter d2 of the scattered charged-particle beam, and the non-scattered charged-particle ratio N0/(N0+N1) are determined using the values. As described above, a computation expression or a computation table is prepared in advance, and thus the diameters and the ratio are automatically calculated using the expression and table with the known parameters stored in the computer. The deconvolution processing is performed on the acquired image using the results, thereby making it possible to remove the effect of the scattering of the beam. Here, in some cases, the image restoration result is inappropriate in a case where the barrier film-to-specimen distance is different from assumption of a user. In this case, without using an automatically calculated value, the user may manually input the beam diameter d1 of the non-scattered charged-particle beam, the beam diameter d2 of the scattered charged-particle beam, and the non-scattered charged-particle ratio N0/(N0+N1). Buttons 726 and 727 may be provided to select setting of whether the values are automatically calculated or the user inputs the values. Meanwhile, in a case where the operation is complicated, a portion 725 on which the parameters are set may not be displayed. Accordingly, the user can input the parameters used in the image restoration processing, and thereby the user can search for a beam shape close to that in reality. Otherwise, the user adjusts the parameters, and as a result, it is possible to obtain an insight that the beam shape used when the image is closest to the ideal image is close to the actual beam shape.

When an image is called, and a file, in which image acquisition information when the image is acquired is recorded, is read, it is possible to save time and effort to input the accelerating voltage and the magnification.

In addition, the parameters may collectively be replaced with any parameters and the replaced parameters may be input. For example, the parameters may be replaced with a parameter representing intensity of the deconvolution processing. More specifically, an intensity level of the image restoration processing is divided from 1 to 10, level 1 may correspond to d2/d1=10, and level 10 may correspond to d2/d1=1,000. In this case, instead of inputting the values of the parameters, input means such as a slide bar may be displayed. Accordingly, when the user performs the image restoration at an image restoration processing level and a satisfied result is not obtained, the user may again perform the image restoration at another level. Since a parameter that the user needs to select is only the level of the image restoration processing, the setting is performed with a very simple operation.

<Specific-Region Image Restoration>

FIG. 5 shows a view of a result of the processing on the entire image. However, in a case where the specimen 6 is formed to have significant unevenness as in FIG. 10, or the like, the distance between the barrier film 10 and the specimen 6 is not uniform and the distance between the barrier film and a surface of the specimen depends on a position on the specimen. For example, the distance between the barrier film and a surface of the specimen at a position of 6a is Z1, and the distance between the barrier film and a surface of the specimen at a position of 6b is Z2. When the distances between the barrier film and the surfaces of the specimen are different depending on positions on the specimen, the parameters of the scattering lens function are changed. Therefore, when the incident beam shape 305 is incident, the beam shape 306 of the charged-particle beam which reaches the surface of the specimen is formed as shown in a lower view in FIG. 10. In other words, since the shapes or the numbers of the beams formed of the non-scattered charged particles and the scattered charged particles are different from each other, the beam shape obtained when the beam reaches the surface of the specimen is changed. Therefore, it is not optimal to perform, using one scattering lens parameter, the image restoration processing collectively on the entire region of the image which has both the specimen 6a portion and the specimen 6b portion together.

Therefore, the image restoration is performed, using different parameters, on the images in the vicinity of 6a and in the vicinity of 6b. FIG. 11 shows an operation screen for performing the processing. The screen 700 includes the image read button 710, the image display section 702 on which a read image is displayed, and the image display section 703 on which an image obtained after the restoration is displayed. The sections, such as the image restoration parameter setting section 705 which are not described, are the same as described in FIG. 9. On the screen 700, a region setting portion 729, on which an image restoration target region is set, is provided. On the region setting portion 729, it is possible to select a shape such as a quadrangle, a circle, or a triangle, and it is possible to input a range depicted in an intended shape on the image display section 702. The image restoration is performed, using a designated parameter, on the image contained in the displayed shape. In other words, the user can designate a region of one image on which the image restoration processing is performed, on the screen 700. It may be possible to set a region not only using the known shapes such as the quadrangle or the circle, but also freely drawing a freehand region by a user.

In addition, it may be possible to set, as targets of the image restoration, a plurality of regions on one image, using the same parameter. For example, a region 730 and a region 731 in the drawing are the target regions. When the image restoration start button 723 is pressed in such a state, the image restoration is started, and an image obtained after the restoration is displayed on the image display section 703. In this state, a mode, in which the image restoration is performed on two positions using the same parameter, is shown. Next, in a case of desiring to perform the image restoration on different regions with different parameters, for example, when the restored image call button 729 is pressed, a restored image is called on the image display section 702. Then, the same procedures are repeated, and thereby it is possible to perform the image restoration using still other parameters, and to overwrite the result.

In addition, as another example, an input column 733 (multi-parameter setting section), on which a parameter can be set for each region, may be provided on the image restoration parameter setting section 705 as shown in FIG. 12. A button, which explicitly shows that the region selection corresponding to the input value parameter can be performed, may be provided on the multi-parameter setting section. The parameter is set in a state in which the selection button (button or the like in a region A in the drawing) is pressed, a shape is selected on the region setting portion 729, and the region 730 (A portion in the drawing) is designated on the image display section 702. Next, a button (region B button in the drawing) of another parameter is selected on the multi-parameter setting section, and similarly, the other region 731 (B portion in the drawing) is selected. In this manner, since it is possible to perform the image restoration collectively on the region 730 and the region 731 on one image, using different parameters from each other, there is no need to perform an operation of reading of the stored image again.

<Description of Procedure>

Hereinafter, the procedure of performing image acquisition will be described with reference to FIG. 13. First, the acceleration voltage E is set in step 500. Next, an image is captured in step 501. Then, the intended image is stored in step 502. An image on which the image restoration processing is performed is selected from the stored images. Otherwise, an intended image may be called (step 511). Next, in step 512, setting of the accelerating voltage E or the magnification (or pixel size) used during the image acquisition is performed. In the next step 503, a region on the image, on which the image restoration is performed, is set. In a case where the image restoration processing is performed on the entire image, the step may be skipped. Next, in step 504, the barrier film-to-specimen distance Z is set. As described above, the parameter set in step 504 may not be the barrier film-to-specimen distance Z, but may be any replaced parameter. In step 505, a parameter related to the scattered charged-particle beam is determined using the set parameter. The parameter related to the scattered charged-particle beam is the beam diameter d1 of the non-scattered charged-particle beam, the beam diameter d2 of the scattered charged-particle beam, the non-scattered charged-particle ratio N0/(N0+N1), or the like. As described above, in a case of desiring to manually input the parameter related to the scattered charged particles, the parameter is input in this step.

In addition, as shown in FIG. 12, in a case of desiring to set a plurality of image restoration target regions, the process returns to step 503 and another image restoration target region is determined. When the set parameter has a satisfied value, the image restoration is started. Next, the restored image is checked (step 507), and, when the result is not satisfied, the parameter is again set. The restored image is stored (step 510) if there is no problem, and the image restoration processing is ended.

In addition, as described above with reference to FIG. 9, since it is very complicated to input the parameters in the processes from steps 504 to 505, the parameters may be replaced with a parameter representing the intensity of the deconvolution processing and then, calculation may be performed.

In addition, in a case where information on the accelerating voltage or the magnification used when a microscope stores an image is stored in an image file as is, in a case where the information is stored in another file, or the like, the files are read at the same time as the image file is called in step 511, and thereby step 512 can also be skipped.

It is also possible to perform the image restoration processing of the present example in a separate computer from the charged-particle microscope device. FIG. 14 shows this state. The computer 35 is provided to be attached to the charged-particle microscope device and a separated computer 35' from the computer is provided. The computer 35 and the computer 35' can transmit and receive data with each other via communication wiring, a recording medium, or the like. The charged-particle microscope image obtained in a state of containing the scattered charged-particle beam is transmitted to the computer 35' via the computer 35. In the computer 35', it is possible to set the parameters used in the image restoration as described above and to set a region as the image restoration target, on an operation screen as in FIG. 11 or 12. Then, the image data received in the computer 35' is called and the image restoration is performed as in step 511 in FIG. 13. In a case where the image restoration is performed in the separately disposed computer 35', there is no need to provide a setting section of irradiation conditions or focal point adjustment of the charged-particle beam unlike the operation screen in FIG. 9. According to the embodiment in FIG. 14, since it is possible to perform the image restoration operation in a separated computer without using the computer 35 that controls the charged-particle microscope, it is possible to efficiently perform the image acquisition and the image restoration. Further, in the embodiment in FIG. 14, dedicated software is installed in the computer 35', thereby making it possible to perform the image restoration processing of the present example. The dedicated software has at least a function of displaying an operation screen on which it is possible to set the parameters as shown in FIG. 11 or 12, and a function of determining the scattering lens function using the parameters and of performing the image restoration processing. The dedicated software is stored in a non-transitory and tangible computer-readable recording medium.

The charged-particle-beam device with which the specimen is observed in the atmosphere as described in the present example or other Examples can be used by a novice who is not accustomed to using the charged-particle-beam device, and thus it is not considered that it is completely easy to dispose the specimen at a position at which the optimal image can be acquired. However, according to the method described in the present example, it is possible to acquire a good-quality image by performing the image restoration even when the specimen and the barrier film are disposed at a distance from each other. As a result, it is possible to achieve an effect that usability is significantly improved without causing damage to the barrier film and the specimen.

As above, the device and the method in which the image restoration is performed depending on the distance between the specimen and the barrier film are described in the present example; however, the respective control configuration, wiring path, and the operation screen may be disposed at a position other than that described above, and the device belongs to the category of the SEM to the charged-particle-beam device of the present example as long as the device has the function intended to be performed in the present example.

Example 2

Hereinafter, a configuration of a device in which observation of the specimen can be easily performed in the atmosphere by using a common charged-particle-beam device. FIG. 15 is a view of an entire configuration of the charged-particle microscope according to the present example. Similar to Example 1, the charged-particle microscope of the present example is also configured to include the charged-particle optical lens tube 2, the housing (vacuum chamber) 7 which supports the charged-particle optical lens tube with respect to a device mounting surface, the specimen stage 5, or the like. Since operations and functions of the respective components or additional components added to the respective components are substantially the same as those in Example 1, detailed description thereof is omitted.

In this configuration, a second housing (attachment) 121, which is used by being inserted into the housing 7 (hereinafter, first housing), is provided. The second housing 121 is configured to include a rectangular parallelepiped main body 131 and a matching section 132. As will be described below, at least one side surface of the side surfaces of the rectangular parallelepiped shape of the main body 131 is an opened face 15. The surfaces of the side surfaces of the rectangular parallelepiped shape of the main body 131 other than the surface, on which the barrier film holding member 155 is provided, may be formed by walls of the second housing 121 or may be formed by the side walls of the first housing 7 in a state in which the second housing 121 does not have a wall and is incorporated in the first housing 7. The second housing 121 is fixed to the side surfaces or the inner wall surface of the first housing 7 or to the charged-particle optical lens tube. The main body 131 has a function of accommodating the specimen 6 as the observation target and is inserted into the inside of the first housing 7 through the opening described above. The matching section 132 configures a matching surface to an outer wall surface on the side surface side on which the opening of the first housing 7 is provided and the matching section is fixed to the outer wall surface on the side surface side described above through the vacuum sealing member 126. In this manner, the entire second housing 121 is fitted in the first housing 7. In the simplest way, the opening described above can be formed using the opening for loading and unloading the specimen, which is originally provided in a vacuum specimen chamber of the charged-particle microscope. In other words, when the second housing 121 is manufactured by matching the size of the hole originally opened and the vacuum sealing member 126 is attached around the hole, the device is minimally modified. In addition, the second housing 121 can be removed from the first housing 7.

The side surface of the second housing 121 is the opened face 15 which communicates with an aerial space through at least a plane having a size with which the specimen can enter and exit and the specimen 6 accommodated inside (on right side from a dotted line in the drawing, hereinafter, referred to as a second space) the second housing 121 is left in the atmospheric pressure state during observation. Further, FIG. 15 is a sectional view of the device in a parallel direction to the optical axis and thus only one surface of the opened face 15 is shown; however, when vacuum sealing is performed by the side surface of the first housing in a back direction and a front direction of the paper surface in FIG. 15, the opened face 15 of the second housing 121 is not limited to the one surface. The opened face may be provided at least one or more surfaces in a state in which the second housing 121 is incorporated in the first housing 7. Meanwhile, the vacuum pump 4 is connected to the first housing 7 such that the closed space (hereinafter, referred to as a first space), which is configured by the inner wall surface of the first housing 7, the outer wall surface of the second housing, and the barrier film 10, can be subjected to vacuuming. The barrier film is disposed such that a pressure in the second space is higher than a pressure in the first space, and thereby, in the present example, the second space can be separated in terms of the pressure. In other words, while the first space 11 is maintained in a high vacuum by the barrier film 10, the second space 12 is maintained in the atmospheric pressure or in a gas atmosphere having pressure substantially the same as the atmospheric pressure. Therefore, it is possible to maintain the charged-particle optical lens tube 2 and the detector 3 in a vacuum state during an operation of the device and it is possible to maintain the specimen 6 in the atmospheric pressure. In addition, since the second housing 121 has the opened face, the specimen 6 can be freely replaced during the observation. In other words, while the first space 11 is in the vacuum state, it is possible to move the specimen 6 in the atmosphere and to bring the specimen in and out of the device.

In a case where the entire second housing 121 is fitted in the first housing 7, the barrier film 10 is provided at a position on the top surface side of the second housing 121, which is right below the charged-particle optical lens tube 2 described above. The barrier film 10 can transmit or allow the primary charged-particle beam, which is discharged from the lower end of the charged-particle optical lens tube 2, to pass therethrough, and the primary charged-particle beam finally reaches the specimen 6 through the barrier film 10.

The specimen stage 5 is disposed inside the second housing 121. The specimen 6 is disposed on the specimen stage 5. The specimen stage 5 is used to cause the barrier film 10 and the specimen 6 to approach each other. The specimen stage may be manually operated, a drive mechanism such as an electric motor may be provided in the specimen stage 5 so as to operate the specimen stage by telecommunications from the outside of the device.

As described above, an attachment portion included in the barrier film is introduced, thereby making it possible to observe the specimen in the atmosphere or in the gas atmosphere using the charged-particle-beam device that performs imaging in the normal vacuum. In addition, it is easy for the attachment of the present example to have a large size thanks to a method in which the attachment is inserted from the side surface of the specimen chamber.

In the configuration of the device of the present example, it is also possible to achieve the effect that it is possible to easily and accurately adjust the specimen position, using the method described in Example 1, without causing damage to the barrier film and the specimen.

In the configuration of the device described in the present example, since the beam shape is degraded due to the scattering in the barrier film and the scattering in the atmospheric space between the barrier film and the specimen, it is effective to perform the image restoration described above. Since the parameters used in the image restoration and the method of the image restoration processing are the same as described above, description thereof is omitted.

Example 3

FIG. 16 is a view of an entire configuration of the charged-particle microscope according to the present example. Similar to Example 2, the charged-particle microscope of the present example is also configured to include the charged-particle optical lens tube 2, the first housing (vacuum chamber) 7 which supports the charged-particle optical lens tube with respect to a device mounting surface, the second housing (attachment) 121 which is used by being inserted into the first housing 7, the control system, or the like. Since operations and functions of the respective components or additional components added to the respective components are substantially the same as those in Example 1 or 2, detailed description thereof is omitted.

In the case of the charged-particle microscope of the present example, the opened face which forms at least one side surface of the second housing 121 can be covered with a lid member 122, and thus various functions can be realized. Hereinafter, the functions will be described.

In the charged-particle microscope of the present example, the specimen stage 5 as means for causing an observation field to move by changing the position of the specimen is connected to the lid member 122. In the specimen stage 5, an XY drive mechanism in the in-plane direction and a Z-axial drive mechanism in a height direction are provided. A support plate 107 as a bottom plate, which supports the specimen stage 5, is attached to the lid member 122 and the specimen stage 5 is fixed to the support plate 107. The support plate 107 is attached to extend toward a surface of the lid member 122, which faces the second housing 121, and toward the inside of the second housing 121. Shafts from the Z-axial drive mechanism and the XY drive mechanism extend, respectively, and are continuous to an operation knob 108 and an operation knob 109 which are included in the lid member 122, respectively. The device user adjusts a position of the specimen 6 in the second housing 121 by operating the operation knobs 108 and 109.

In the charged-particle microscope of the present example, there is provided a function of supplying replacement gas into the second housing. For example, there are provided a gas cylinder and a gas supply pipe. Otherwise, instead of the cylinder and pipe, there may be provided a function of enabling a pressure state different from that in the first space 11 or the outside air on the outside of the device to be formed. For example, a pump that can perform the vacuuming to a small extent is provided. The charged-particle beam discharged from the lower end of the charged-particle optical lens tube 2 passes through the first space which is maintained in the high vacuum, passes through the barrier film 10, and further enters the second space which is maintained at atmospheric pressure or at a low-vacuum level (than the first space). Then, the specimen 6 is irradiated with the charged-particle beam. Since the electron beam is scattered due to gas molecules in the aerial space, the mean free path is short. In other words, when the barrier film 10 and the specimen 6 are disposed at a good distance, secondary electrons, reflection electrons, transmission electrons, or the like, which is produced from the primary charged-particle beam or the charged-particle-beam irradiation does not reach the specimen and the detector 3. Meanwhile, a scattering probability of the charged-particle beam is proportional to a mass number or density of gas molecules. Hence, when the air in the second space is replaced with gas molecules which are lower in the mass number than the atmosphere or vacuuming is performed to a small extent, the scattering probability of the electron beam is lowered and the charged-particle beam can reach the specimen. In addition, gas replacement or vacuuming may need to be performed not in the entire second space, but on at least a passing path of the charged-particle beam in the second space, that is, a space between the barrier film 10 and the specimen 6.

For the reasons described above, in the charged-particle microscope of the present example, an attachment portion (gas introducing portion) of a gas supply pipe 100 is provided in the lid member 122. Here, the pipe is referred to as the gas supply pipe; however, the pipe is used as a discharge pipe, and thereby a pipe subjected to vacuum to the small extent as described above is used. The gas supply pipe 100 is connected to a gas cylinder 103 by a connection unit 102 and thereby replacement gas is introduced into the second space 12. A gas control valve 101 is disposed on the gas supply pipe 100 and can control a flow rate of replacement gas flowing in a pipe. Therefore, a signal line extends from the gas control valve 101 to the lower-rank control unit 37 and the device user can control the flow rate of the replacement gas on an operation screen displayed on a monitor of the computer 35. In addition, the gas control valve 101 may be manually opened and closed.

As types of replacement gases, as long as a gas which is more lightweight than the atmosphere, such as nitrogen or water vapor, is used, an improvement effect of an image S/N ratio is found; however, when a helium gas or a hydrogen gas, which has a more lightweight mass, is used, an improvement effect of an image S/N ratio is increased.

Since the replacement gas is a lightweight element gas, the gas is likely to remain in the upper section of the second space 12 and the gas on the lower side is unlikely to be replaced. Therefore, an opening, which communicates with the inside and the outside of the second space, is provided on the lower side from the attachment position of the gas supply pipe 100 in the lid member 122. For example, in FIG. 16, an opening is provided at the attachment position of a pressure regulating valve 104. In this manner, since an atmospheric gas is pressed by the lightweight element gas introduced from the gas introducing path and is discharged from the opening on the lower side, the gas replacement can be efficiently performed in the second housing 121. Further, the opening may serve as a crude exhaust port to be described below.

The pressure regulating valve 104 may be provided instead of the opening described above. The pressure regulating valve 104 has a function of automatically opening a valve when an internal pressure of the second housing 121 becomes 1 atm or higher. The pressure regulating valve having such a function is provided, and thus, during introduction of the lightweight element gas, the valve is automatically opened when the internal pressure becomes 1 atm or higher. Then, atmosphere gas components such as nitrogen, oxygen, or the like, can be discharged to the outside of the device and the inside of the device is filled with the lightweight element gas. Further, the gas cylinder or the vacuum pump 103 shown in the drawings is provided in and attached to the charged-particle microscope in some cases, and the device user attaches as necessary in some cases.

In addition, in some cases, although the lightweight element gas such as the helium gas or the hydrogen gas is provided, electron beam scattering is significant. In this case, the gas cylinder 103 may be used instead of a vacuum pump. Also, the vacuuming is performed to the small extent, and thereby the inside of the second housing can be in an extremely low vacuum state (that is, atmosphere having a pressure approximate to the atmospheric pressure). In other words, the space between the barrier film 10 and the specimen 6 can be in the vacuum state. For example, a vacuuming port is provided in the second housing 121 or the lid member 122 and the inside of the second housing 121 is subjected to vacuuming to the small extent. Then, the replacement gas may be introduced in. The vacuuming in this case may be performed to reduce the atmosphere gas components, which remain inside the second housing 121, so as to be equal to or lower than a certain amount such that there is no need to perform high vacuuming but the crude exhaust is sufficient. Further, a pressure gauge 80, which can monitor the pressure of the space 12, may be provided.

In addition, although not shown in the drawing, the cylinder 103 portion may be a multi-gas control unit, in which the gas cylinder is connected to the vacuum pump in a composite manner. Although not shown in the drawing, a heating mechanism for heating the specimen 6 may be disposed inside the second housing 121.

In addition, in addition to a secondary electron detector or a reflected electron detector, an X-ray detector or an optical detector may be provided, and thereby it may be possible to perform the EDS analysis or detection of fluorescence beam. An X-ray detector or a light detector may be disposed in any of the first space 11 or the second space 12.

Accordingly, in the configuration of the device, it is possible to control the space in which the specimen is disposed such that the space is in a degree of vacuum from the atmospheric pressure of (about $10^5$ Pa) to about $10^3$ Pa. In a so-called low-vacuum scanning electron microscope of the related art, since an electron beam column communicates with the specimen chamber, the pressure of the electron beam column is likely to be linked and to be changed when the degree of vacuum of the specimen chamber is lowered and the pressure is approximate to the atmospheric pressure. Thus, it is difficult to control the pressure of the specimen chamber to be the pressure of the atmospheric pressure (about $10^5$ Pa) to about $10^3$ Pa. According to the present example, since the second space and the first space are separated by the thin film, it is possible to freely control the pressure and the gas species of the atmosphere in the second space 12 surrounded by the second housing 121 and the lid member 122. Hence, it is possible to control the pressure of the specimen chamber to be the pressure of the atmospheric pressure (about $10^5$ Pa) to about $10^3$ Pa which is difficult to control. Further, it is possible to perform not only observation at the atmospheric pressure (about $10^5$ Pa), but also the observation of the state of the specimen, which is obtained by continuously changing the pressure such that the pressure is approximate to the atmospheric pressure. In other words, the configuration according to the present example is characterized in that the second space 12 inside the second housing is closed, compared to the configuration described above. Therefore, it is possible to provide a charged-particle-beam device in which a gas can be introduced through between the barrier film 10 and the specimen 6 or it is possible to perform the vacuuming.

In the present example, all of the specimen stage 5, the operation knobs 108 and 109, the gas supply pipe 100, and the pressure regulating valve 104 are collectively attached to the lid member 122. Hence, the device user can perform operations of the operation knobs 108 and 109, a replacement operation of the specimen, or operations of the gas supply pipe 100 or the pressure regulating valve 104 on the same surface of the first housing. Hence, operability is significantly improved, compared to the charged-particle microscope having a configuration in which the components are separately attached to other surfaces of the specimen chamber.

In addition to the configuration described above, a contact monitor which detects a contact state of the second housing 121 and the lid member 122 is provided, and monitoring of whether the second space is closed or opened may be performed.

As above, with the device of the present example, in addition to the effects in the Examples 1 and 2, it is possible to perform observation at atmospheric pressure, in the desired replacement gas species, or in the desired pressure. In addition, the observation of the specimen can be performed in the atmosphere having a pressure which is different from that in the first space. In addition, the barrier film is removed and the first space communicates with the second space. In addition to the observation in the atmosphere or in a predetermined gas atmosphere, the SEM, in which it is possible to observe the specimen in a vacuum state which is the same as that of the first space, is realized. According to the configuration of the device of the present example, it is also possible to achieve an effect that it is possible to easily and accurately adjust the specimen position by using the method described in Example 1 or 2, without causing damage to the barrier film or the specimen.

In the present example, the primary charged-particle beam is scattered due to the barrier film and the gas in the non-vacuum space between the barrier film and the specimen. It is possible to remove the effect of the scattering on the spot shape of the primary charged-particle beam in the same method described above. The parameters and the computation processing method are the same as described above. Here, in the device in the present example, the gas is introduced to between the specimen and the barrier film, and a specimen-reaching beam shape shown in FIG. 4 is changed in a case where the pressure is lower than the atmospheric pressure. This is because the scattering lens function of the scattering lens 12a corresponding to the space 12 in FIG. 3 is changed.

In other words, the gas species a and the gas pressure P in (Expression 2) are changed. There is a need to set a indicating the small amount of scattering by causing the lightweight element gas entering the space between the specimen and the barrier film, and there is a need to set the pressure P indicating the smaller amount of scattering in a case where the vacuuming is performed to the small extent. In addition, in a case where the distance between the specimen and the barrier film is changed due to the introduction of the gas or the vacuuming to the small extent, there is a need to input a new changed parameter. As described above, when the lightweight element gas is introduced or the pressure is lower than the atmospheric pressure, the mean free route extends and thus, the beam diameter d2 of the scattered charged particles tends to become shorter. Therefore, it is possible to perform the image restoration to be described above on the operation screen of the device in the present example, by providing a setting section, on which it is possible to input the gas species a which is introduced to the space 12 and the gas pressure P measured by the pressure gauge 80, on the operation screen in FIG. 9 or the like.

Example 4

In the present example, a configuration in which the charged-particle optical lens tube 2 is disposed below the barrier film 10 in a modification example of Example 1 is described. FIG. 17 shows views of the charged-particle microscope of the present example. The vacuum pump, the control system, and the like are omitted in the drawing. In addition, the housing 7 and the charged-particle optical lens tube 2 which are a vacuum chamber are supported by a column or a prop on a device installed surface. Since operations and functions of the respective components or additional components added to the respective components are substantially the same as Examples described above, detailed description thereof is omitted.

As shown in FIG. 17(a), in the device of the present example, the specimen stage 5 that enables the specimen 6 to approach the barrier film 10 is provided. In the configuration of the device of the present example, the surface of the specimen on the lower side of the specimen 6 in the drawing is observed. In other words, in the configuration of the device of the present example, the upper side of the device is opened as an atmospheric-pressure space. In this case, it is also possible to adjust the distance between the barrier film and the specimen by using the methods described in Examples 1 and 2.

As in FIG. 17(b), the specimen 6 may be directly mounted on the barrier film 10 side (an arrow in the drawing). In this case, the specimen stage 5 is not necessarily provided. In order to cause the barrier film and the specimen 6 to approach each other by applying the method described in Example 1 or 2 to the present example, the contact prevention member 56 that is made of a thin film formed by regulating the thickness thereof, or that is made of a detachable foil material, or the like, is used between the barrier film 10 and the specimen 6. In this case, the contact prevention member 56 corresponds to the distance adjusting mechanism described in Examples 1 and 2. The contact prevention member 56 enables the specimen 6 to be safely disposed. For example, a plurality of the contact prevention members 56 having various known thicknesses are prepared. First, the contact prevention member 56 having the thickness of t1 is disposed on the base 9. Next, the specimen 6 is mounted. In this manner, it is possible to perform the observation by causing the barrier film 10 and the specimen 6 to come into contact with each other, without damage to the barrier film and the specimen.

In any configuration in FIGS. 17(a) and 17(b), since the beam shape is degraded due to the scattering in the barrier film and the scattering in the atmospheric space between the barrier film and the specimen, it is effective to perform the image restoration described above. Since the parameters used in the image restoration and the method of the image restoration processing are the same as described above, description thereof is omitted.

Example 5

In Examples described above, the device and the method, in which the observation of the specimen is performed using the charged-particle microscope when the barrier film 10 and the specimen 6 are disposed in the atmosphere in the state in which the barrier film is not in contact with the specimen, are described. In the present example, a method of performing the image restoration in a device in which the specimen disposed in the atmosphere in a state in which the barrier film is in contact with the specimen is observed with the microscope is described.

Figure 18A:
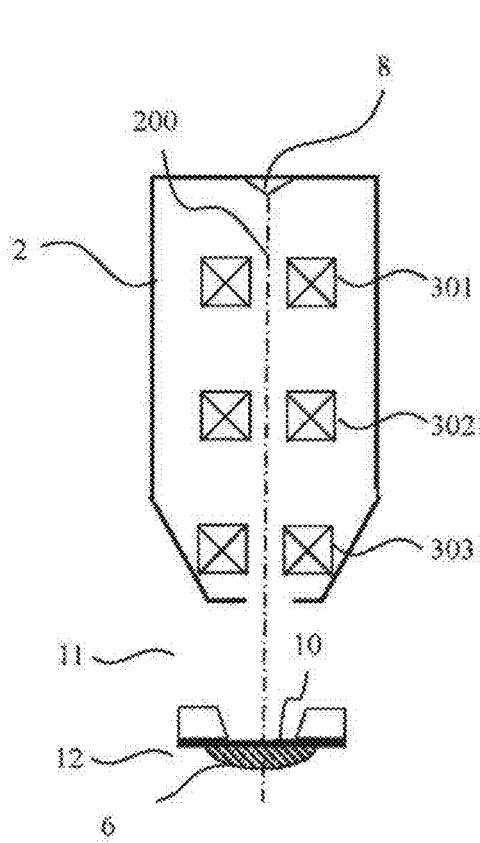
FIGS. 18A and 18B are views illustrating a fundamental principle.
Figure 18B:
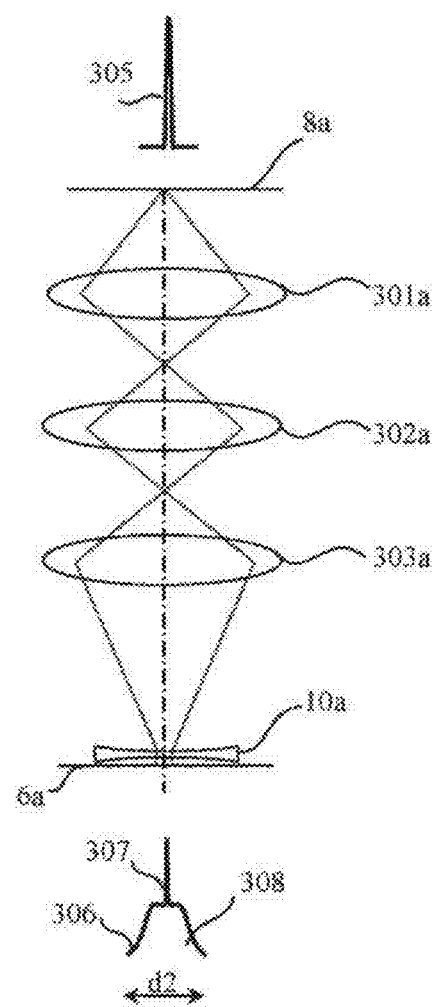

The common components of the charged-particle-beam device in which the observation is performed in the atmospheric pressure are described with reference to FIG. 18. Description of the same components as in FIG. 3 is omitted. In FIG. 18, the under surface side of the barrier film 10 in the drawing is the non-vacuum space and the upper side of the barrier film 10 in the drawing is the vacuum space. The specimen comes into contact with the barrier film 10 and is held. FIG. 18 (b) shows a view of this configuration depicted in a simplified manner. Since the specimen is in contact with the barrier film 10, the scattering lens 12a corresponding to the non-vacuum space as shown in FIG. 3 does not exist. In other words, only the scattering lens 10a by the barrier film 10 exists, and thereby the amount of the scattering depends on the material type m, the density ρ, and the thickness t of the barrier film 10, and the irradiation energy E of the charged-particle beam. When the scattering lens function (or degradation function) A is set only depending on the barrier film, the scattering lens function is described as follows.

$$A = A(m, \rho, t, E) \quad \text{(Expression 9)}$$

In addition, in a case where F represents the charged-particle-beam shape obtained before the charged-particle beam is incident to the barrier film, and G represents the charged-particle-beam shape obtained after the charged-particle beam is transmitted through the barrier film, description thereof is as follows.

$$G = A(m, \rho, t, E) \times F \quad \text{(Expression 10)}$$

When the beam shape obtained when the beam is incident to the barrier film 10 is the beam 305, the beam shape obtained when the beam reaches the specimen 6 is the beam 306. Since there is no scattering lens (12a in FIG. 3) corresponding to the non-vacuum atmosphere between the barrier film and the specimen, the beams formed due to the scattered charged particles are less produced, comparing to the devices from Example 1 to Example 5. In other words, the beam diameter d2 of the scattered charged particles is small. However, the scattering due to the barrier film 10 is generated to be similar to the case in FIG. 3. As a result, similar to the case in FIG. 3, the beam, which contains the beam 307 by the non-scattered charged-particle beam and the beam 308 by the scattered charged-particle beam together, is formed. Hence, it is effective to use the image restoration method described above.

FIG. 19 shows the charged-particle device in the present example. The charged-particle optical lens tube 2 and the housing 7 are supported by a column or a base (not shown). In addition, as shown in FIG. 17, a configuration, in which the charged-particle optical lens tube is disposed below the barrier film 10, may be employed. This configuration is the same as that in Example 1 except that the specimen 6 is in contact with the barrier film 10. As shown in FIG. 15 or 16 described in Example 2 or 3, a configuration, in which an attachment is connected to the common charged-particle microscope device, may be employed. In a case where the specimen is held by being in direct contact with the barrier film, the specimen 6 is mounted on the barrier film holding member 155, and then, the barrier film holding member 155 is brought into contact with the housing 7 such that the space 11 is in vacuum. In this state, irradiation with the charged-particle beam is performed and an image is acquired. Then, the image restoration described above is performed on the acquired image.

As the next example, another charged-particle microscope device in which observation is performed by causing the barrier film and the specimen to be in contact with each other, is described in FIG. 20. In this configuration, a vessel 100, in which the specimen 6 can be enclosed in a sealed local space in the non-vacuum atmosphere, is disposed on the specimen stage 5 of the charged-particle device. The specimen 6 is in contact with the barrier film 10. The specimen 6 is directly mounted to the barrier film 10 provided in a lid 101 of the vessel 100 on the outside of the charged-particle microscope device. The lid 101 and the vessel 100 are fixed to each other by a screw or the like (not shown). In this manner, the inside of the vessel 100 is held as a space in a local atmosphere, which is different from the space of the outside of the vessel 100. Next, the vessel 100 is introduced in the inside of the charged-current microscope device, and the observation is performed using the charged-particle microscope. In this case, the charged-particle beam discharged from the charged-particle source 8 passes through the vacuum space 11 after through the optical lens 1, and reaches the specimen 6 via the barrier film 10. In this case, since the outside of the vessel 100 is in vacuum, similar to the device in FIG. 19, the factor that causes the charged-particle beam to be scattered is mainly the barrier film 10 alone.

In a case of a configuration of a device in which the specimen 6 is brought into contact with the barrier film, a portion of the specimen, which is brought into contact with the barrier film 10, is observed. Therefore, the scattering of the charged-particle beam depends only on the material type, the density, or the thickness of the barrier film 10. Since the parameters related to the barrier film are known in advance, there is no parameter to be input by a user when calculating (Expression 10). Hence, in the case where the image restoration is performed on the image acquired by the charged-particle microscope device, there is no need to input the barrier film-to-specimen distance as described in the operation screen in FIG. 9. This means that the barrier film-to-specimen distance is 0. As a result, since the shape that the beam shape 306 takes can be obtained in advance, the amount of the scattering due to the barrier film may be stored in the computer 35, and the image restoration processing may be performed using the same parameters all the time during the image acquisition. Here, the portion of the specimen which is to be observed may not be necessarily in contact with the barrier film. In this case, in order to be able to adjust the amount of the scattering, any scattering-amount adjusting unit may be provided.

Since the charged-particle beam is not scattered due to the atmosphere of the non-vacuum space between the barrier film and the specimen in the case of the configuration of the device described in the present example, it is possible to acquire a clearer image. Further, since the user does not need to pay attention to the parameters of the scattering lens function which are changed due to the atmosphere of the non-vacuum space, it is possible to more easily perform the image restoration.

Example 6

In the present example, unlike Examples 1 to 5, an example, in which the barrier film is not disposed and the specimen is disposed in low vacuum or the like, is described. For example, a low-vacuum SEM or the like with which SEM observation can be performed in a low-vacuum region. Hereinafter, the low vacuum is a range from about $10^{-1}$ Pa to $10^3$ Pa. In this case, the charged-particle beam is scattered due to the gas remaining in the low-vacuum environment before the charged-particle beam reaches the specimen. The amount of the scattering is small compared to Examples 1 to 5; however, it is effective to perform the image restoration described above also in the case of the present example.

The common components of the charged-particle-beam device are described with reference to FIG. 21. Description of the same components as in FIG. 3 is omitted. A space 13 on the under surface side of the barrier film 10 in the drawing is the low-vacuum space. The specimen is disposed in low vacuum. In general, since it is not desirable that the periphery of the charged-particle-beam source 8 is in low vacuum, the atmosphere of the charged-particle-beam source 8 is maintained to be in high vacuum ($10^{-1}$ Pa or less) by the vacuum pump 4 and the pipe 16. An aperture 82 or the like having fine pores is provided so as to prevent the gas in the housing 7 from entering the charged-particle source side to the greatest extent. A plurality of apertures may be provided such that the differential pressures may be formed in multiple steps. Hereinafter, the low-vacuum space is formed from the aperture 82 (aperture closest to the specimen in a case where a plurality of apertures are provided) to the specimen 6 (h3 portion in the drawing).

A distance of the low-vacuum space h3 (that is, distance from the aperture to the specimen) is determined relatively with respect to a working distance as a distance from the object lens. The position of the aperture 82 and the position of an object lens 303 are unique for each device and thus, it is possible to obtain the working distance from magnetic field intensity of the object lens 303. In other words, it is possible to obtain a position in focus on the specimen regardless of the position of the specimen. Hence, the distance of the low-vacuum space h3 can be obtained in relative comparison with the working distance.

Figure 21A:
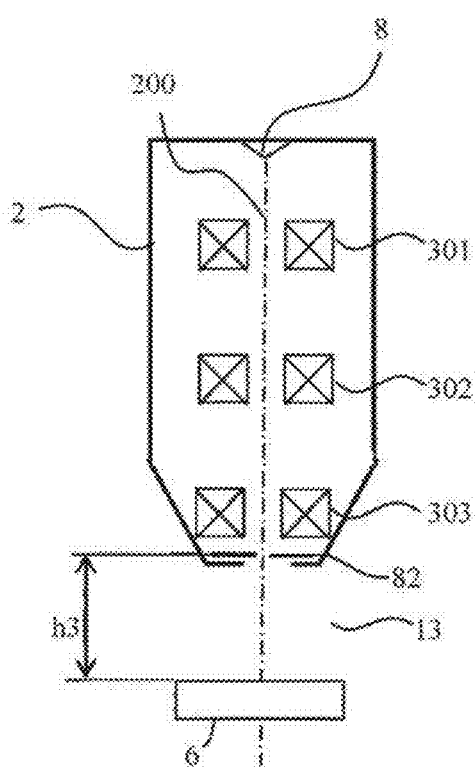
FIGS. 21A and 21B are views illustrating a fundamental principle.
Figure 21B:
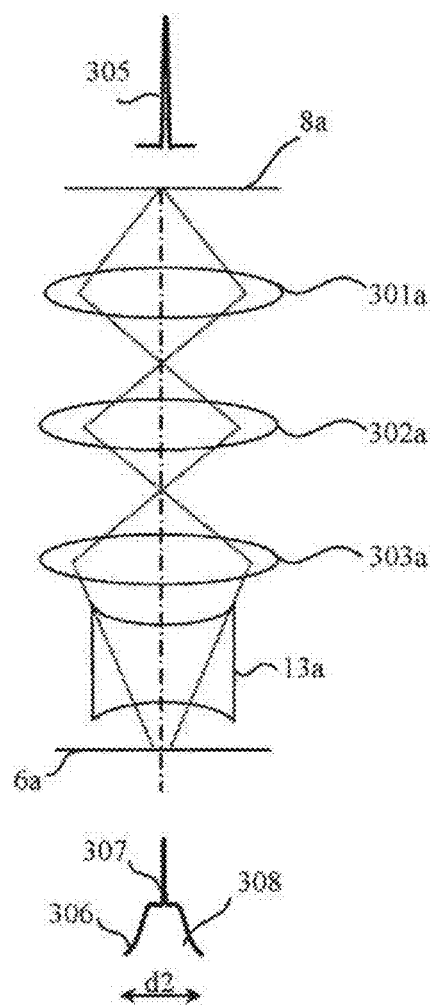

FIG. 21(*b*) shows a view of this configuration depicted in a simplified manner. Since the barrier film 10 is not provided compared to Examples described above, the scattering lens 13a corresponding to the low-vacuum space 13 is the principal factor that causes the charged-particle beam to be scattered. The amount of the scattering depends on the distance z from the barrier film 10 to the specimen 6 (h3 in FIG. 21(*a*)), the gas species a and the gas pressure P (or density) in the low-vacuum space, the irradiation energy E of the charged-particle beam. In other words, when the scattering lens function (or degradation function) A in the low-vacuum space is set in this state, the scattering lens function is described as follows.

$$A = A(a, P, z, E) \tag{Expression 11}$$

In addition, in a case where F represents the charged-particle-beam shape obtained before the charged-particle beam passes through the low-vacuum space, and G represents the charged-particle-beam shape obtained after the charged-particle beam passes through the low-vacuum space, description thereof is as follows.

$$G = A(a, P, z, E) \times F \tag{Expression 12}$$

When the beam shape obtained when the charged-particle beam is incident to the low-vacuum space is the beam 305, the beam shape obtained when the charged-particle beam reaches the specimen 6 is the beam 306. Since there is no scattering lens 12a corresponding to the barrier film, the amount of the scattering of the beam formed of the scattered charged particles is small, comparing to the devices from Example 1 to Example 5. In other words, the beam diameter d2 of the scattered charged particles is small. However, since the beam, which contains the beam 307 by the non-scattered charged-particle beam and the beam 308 by the scattered charged-particle beam together, is formed, it is effective to use the image restoration method described above.

FIG. 22 shows an example of the charged-particle device in the present example. In the device, the specimen is disposed in the low-vacuum space 13. The aperture 82 is provided in the charged-particle optical lens tube 2 such that the gas inside the housing 7 does not enter the charged-particle source 8. In order to maintain the inside of the housing 7 at a degree of low vacuum, a leak valve 81 and the pressure gauge 80 are provided. For example, the leak valve 81 communicates with the atmosphere side and thus, it is possible for an atmospheric gas to enter the inside of the housing 7 depending on the amount of opening and closing of the leak valve. In addition, the pressure gauge 80 can measure the pressure. The leak valve 81 and the pressure gauge 80 are electrically connected to the control unit 36, and thus control of the degree of vacuum can be performed in the computer 35. In addition, although not shown in the drawing, a plurality of vacuum pumps may be provided so as not to allow the gas to be mixed on the charged-particle source side via the pipe 16. Such a device includes a data processing unit that can perform the same image restoration as described above. The image restoration processing described above enables the image quality to be improved by the image restoration performed on the image acquired in the low vacuum.

FIG. 23 shows an example of the operation screen. Description of the same components as in FIG. 9 is omitted. A vacuum-degree setting section 733, on which it is possible to set a degree of vacuum of the inside of the housing 7 and to use the set degree of vacuum, is provided on the operation screen 700. In addition, an input column 734, on which the distance of the low-vacuum space h3 is set, is provided in the image restoration parameter setting section 705. Instead, the specimen height or the working distance from the object lens is input on the input column 734, and the distance of the low-vacuum space h3 may be obtained using the values. In addition, an input column 735, on which the degree of vacuum is set, is provided. As other conditions, the accelerating voltage and the magnification are set. In this manner, the image restoration parameters are set and it is possible to perform the image restoration described above. Accordingly, it is possible to optimize the image restoration processing by a parameter obtained by inputting a user parameter.

In a case where an image as a restoration target is called and is subjected to the processing, or in a case where the displayed image involves information indicating conditions during the image acquisition, a user does not need to input a parameter because the condition such as the accelerating voltage or the magnification is known in advance. In addition, even when the image restoration processing is performed in a computer which is separately disposed from the charged-particle-beam device, reading of a file, in which image acquisition information such as the position of the specimen or the working distance, the degree of vacuum, the accelerating voltage which are used when the image is acquired, or the magnification used when the image is acquired, is executed, and then, it is possible to save effort and time of a user to input all or a part of the parameters described above.

Further, the present invention is not limited to Examples described above and includes various modification examples. For example, Examples described above are described in detail, in order to describe the present invention in an easily understandable manner, and Examples are not necessarily limited to all of the configurations described above. In addition, a part of a configuration of one Example can be replaced with another configuration of another Example and one configuration of one Example can be added to another configuration of another Example. In addition, a part of the configuration of each Example can be added to, removed from, or replaced with another configuration. In addition, a part or all of the respective configurations, functions, processing units, processing means may be realized in hardware by being designed in an integrated circuit or the like. In addition, the respective configurations, functions, or the like, which are described above, may be realized in software by interpreting and executing a program in which a processor realizes the respective functions.

Information in a program which realizes the respective functions, a table, a file, or the like, can be stored in a recording device such as a memory, a hard disc, or a solid state drive (SSD), or can be stored in a recording medium such as an IC card, an SD card, or an optical disk.

In addition, the control line or the information line is shown as is considered to be necessary and there is no need to show all of the control lines or information lines depending on a product. Actually, it may be considered that substantially the entire configurations are connected to one another.

REFERENCE SIGNS LIST

1: optical lens
2: charged-particle optical lens tube
3: detector
4: vacuum pump
5: specimen stage
6: specimen
7: housing
8: charged-particle source
9: base
10: barrier film
11: first space (or vacuum space)
12: second space (or aerial space)
13: low-vacuum space
14: leak valve
16: vacuum pipe
17: stage support table
18: prop
19: lid-member supporting member
20: bottom plate
33: monitor
34: user interface such as keyboard or mouse
35: computer
36: control unit
43, 44, 45: communication cable
52: base
53: optical axis
60: data transmitting/receiving unit
61: data memory
62: external interface
63: data processing unit
64: stage control unit
80: pressure gauge
81: leak valve
82: aperture
100: gas supply pipe
101: gas controlling valve
102: connecting portion
103: gas cylinder or vacuum pump
104: pressure regulating valve
107: support plate
108, 109: operation knob
121: second housing
122, 130: lid member
123, 124, 125, 126, 128, 129: vacuum sealing member
131: main body section
132: matching section
154: signal amplifier
155: barrier holding member
155: base
200: optical axis
301: lens 1
302: lens 2
303: lens 3
305: incident beam shape
306: specimen-reaching-beam shape
307: non-scattered charged-particle beam shape 308: scattered charged-particle beam shape
400: distance control member
401: specimen table
402: internal thread
407: vacuum sealing member
408: distance control member
500: step
700: operation screen
701: condition setting section
702: image display section
703: restored image display section
704: image adjusting section
705: threshold setting section
706: irradiation energy E setting portion
707: irradiation start button
708: irradiation stop button
709: image storage button
710: image read button
711: barrier film-to-specimen distance setting section
713: image restoration start button
715: focal point adjusting portion
716: brightness adjusting portion
717: contrast adjusting portion
720: non-scattered charged-particle diameter setting section
721: scattering charged-particle diameter setting section
722: non-scattered charged-particle ratio setting section
723: image restoration start button
724: automatic contrast adjustment button
725: manual-input section
726: automatic input-selection button
727: manual-input-selection button
728: automatic noise regulation button
729: image restoration target region setting portion
730: setting section
731: setting section
732: magnification setting section
733: multi-parameter setting section
734: vacuum-degree setting section

The invention claimed is:

1. A charged-particle-beam device comprising:
a charged-particle optical lens tube that is subjected to vacuuming inside;
a specimen stage on which a specimen is mounted in a non-vacuum space;
a detector that detects secondary charged particles obtained by irradiation of the specimen with a primary charged-particle beam emitted from the charged-particle optical lens tube; and
a data processing unit that removes, from a detector signal, the effect that scattering of the primary charged-particle beam before the primary charged-particle beam reaches the specimen has on the spot shape of the primary charged-particle beam.

2. The charged-particle-beam device according to claim 1, further comprising:
a barrier film that can hold differential pressure between a space which communicates with the inside of the charged-particle optical lens tube and which remains in a vacuum state, and the non-vacuum space in which the specimen is disposed, and that transmits or allows the primary charged-particle beam to pass,
wherein the data processing unit removes, from the detector signal, the effect that scattering of the primary charged-particle beam when the primary charged-particle beam passes through the barrier film has on the spot shape of the primary charged-particle beam.

3. The charged-particle-beam device according to claim 2, wherein the data processing unit obtains the effect on the spot shape of the primary charged-particle beam, depending on a material type, density, and the thickness of the barrier film.

4. The charged-particle-beam device according to claim 1, wherein the data processing unit removes, from the detector signal, the effect that scattering of the primary charged-particle beam due to a gas in the non-vacuum space has on the spot shape of the primary charged-particle beam.

5. The charged-particle-beam device according to claim 4, wherein the data processing unit obtains the effect on the spot shape of the primary charged-particle beam, depending on the types of gas, a distance by which the primary charged-particle beam passes through the non-vacuum space, and pressure of the gas.

6. The charged-particle-beam device according to claim 1, wherein a ratio of a length h1 of the charged-particle optical lens tube to a distance h2 by which the primary charged-particle beam passes through the non-vacuum space satisfies $h1/h2 \geq 1{,}000$, in which h2 is equal to or less than 1 mm.

7. The charged-particle-beam device according to claim 1, wherein the data processing unit generates a model of the spot shape of the primary charged-particle beam when the primary charged-particle beam reaches the specimen, using a spot shape of a non-scattered charged-particle beam of the primary charged-particle beams, which is not scattered before reaching the specimen, and a spot shape of scattered charged-particle beam of the primary charged-particle beams, which is scattered before reaching the specimen.

8. The charged-particle-beam device according to claim 7, wherein a width (d1) of the spot shape of the non-scattered charged-particle beam is 1 nm to 100 nm,
wherein a width (d2) of the spot shape of the scattered charged-particle beam is 10 nm to 10,000 nm, and
wherein a relationship between the width d1 and the width d2 satisfies $d2/d1 \geq 10$.

9. The charged-particle-beam device according to claim 1, further comprising:
a display that displays an operation screen on which a user can designate a region as an image restoration processing target on an image formed based on a signal from the detector.

10. The charged-particle-beam device according to claim 1, further comprising:
a display that displays an operation screen on which a user can designate a first region on which image restoration processing is performed using a first parameter set, and a second region on which image restoration processing is performed using a second parameter different from the first parameter set on an image formed based on a signal from the detector.

11. A specimen-image acquisition method comprising:
emitting a primary charged-particle beam from a charged-particle optical lens tube that is subjected to vacuuming inside;
irradiating, with the primary charged-particle beam, a specimen mounted in a non-vacuum space;
detecting secondary charged particles obtained by irradiation of the specimen with the primary charged-particle beam; and
removing, from a detector signal, the effect that scattering of the primary charged-particle beam before the primary charged-particle beam reaches the specimen has on the spot shape of the primary charged-particle beam.

12. The specimen-image acquisition method according to claim 11, further comprising:

causing the primary charged-particle beam emitted from the charged-particle optical lens tube to be transmitted through or to pass through a barrier film which can hold differential pressure between a space that communicates with the inside of the charged-particle optical lens tube and that remains in a vacuum state, and the non-vacuum space in which the specimen is disposed; and removing, from the detector signal, the effect that scattering of the primary charged-particle beam when the primary charged-particle beam passes through the barrier film has on the spot shape of the primary charged-particle beam.

13. The specimen-image acquisition method according to claim 12, further comprising:

obtaining the effect on the spot shape of the primary charged-particle beam, depending on a material type, density, and the thickness of the barrier film.

14. The specimen-image acquisition method according to claim 11, further comprising:

removing, from the detector signal, the effect that scattering of the primary charged-particle beam due to a gas in the non-vacuum space has on the spot shape of the primary charged-particle beam.

15. The specimen-image acquisition method according to claim 14, further comprising:

obtaining the effect on the spot shape of the primary charged-particle beam, depending on the types of gas, a distance by which the primary charged-particle beam passes through the non-vacuum space, and pressure of the gas.

16. The specimen-image acquisition method according to claim 11, further comprising:

generating a model of the spot shape of the primary charged-particle beam when the primary charged-particle beam reaches the specimen, using a spot shape of a non-scattered charged-particle beam of the primary charged-particle beams, which is not scattered before reaching the specimen, and a spot shape of scattered charged-particle beam of the primary charged-particle beams, which is scattered before reaching the specimen; and obtaining the effect on the spot shape of the primary charged-particle beam using the model.

17. The specimen-image acquisition method according to claim 16, wherein a width (d1) of the spot shape of the non-scattered charged-particle beam is 1 nm to 100 nm, wherein a width (d2) of the spot shape of the scattered charged-particle beam is 10 nm to 10,000 nm, and wherein a relationship between the width d1 and the width d2 satisfies $d2/d1 \geq 10$.

18. The specimen-image acquisition method according to claim 11, further comprising:

performing image restoration processing on a part of region, which is designated by a user, on an image formed based on a signal from the detector.

19. The specimen-image acquisition method according to claim 11, wherein a user can designate a first region on which image restoration processing is performed using a first parameter set, and a second region on which image restoration processing is performed using a second parameter different from the first parameter set on an image formed based on a signal from the detector.

20. A program recording medium that stores a program executed by a computer connected to a charged-particle-beam device including a charged-particle optical lens tube that is subjected to vacuuming inside, a specimen stage on which a specimen is mounted in a non-vacuum space, and a detector that detects secondary charged particles obtained by irradiation of the specimen with a primary charged-particle beam emitted from the charged-particle optical lens tube, wherein the program performs a process of removing, from a detector signal, the effect that scattering of the primary charged-particle beam before the primary charged-particle beam reaches the specimen has on the spot shape of the primary charged-particle beam.

* * * * *